US00RE43212E

(19) United States
(12) Reissued Patent
Kim et al.

(10) Patent Number: US RE43,212 E
(45) Date of Reissued Patent: Feb. 21, 2012

(54) TURBO INTERLEAVING APPARATUS AND METHOD

(75) Inventors: Min-Goo Kim, Suwon-si (KR); Beong-Jo Kim, Songnam-si (KR); Soon-Jae Choi, Songnam-si (KR); Young-Hwan Lee, Songnam-si (KR)

(73) Assignee: Samsung Electronics Co., Ltd (KR)

(21) Appl. No.: 10/973,100

(22) Filed: Oct. 25, 2004

Related U.S. Patent Documents

Reissue of:
(64) Patent No.: 6,598,202
Issued: Jul. 22, 2003
Appl. No.: 09/575,084
Filed: May 19, 2000

(30) Foreign Application Priority Data

May 19, 1999 (KR) ..... 1999-18928
May 21, 1999 (KR) ..... 1999-18560

(51) Int. Cl.
*H03M 13/03* (2006.01)

(52) U.S. Cl. ..... 714/786; 714/788

(58) Field of Classification Search ..... 714/776, 714/788, 786, 787, 761, 759, 752; 704/229; 375/299

See application file for complete search history.

(56) References Cited

U.S. PATENT DOCUMENTS

| | | | | |
|---|---|---|---|---|
| 4,802,170 | A | 1/1989 | Trottier | |
| 5,446,474 | A | 8/1995 | Wade et al. | |
| 5,446,747 | A | 8/1995 | Berrau | |
| 5,483,541 | A | 1/1996 | Linsky | |
| 5,537,420 | A | 7/1996 | Huang | |
| 5,548,775 | A | 8/1996 | Hershey | |
| 6,035,434 | A * | 3/2000 | Sazzad et al. | 714/776 |
| 6,101,465 | A * | 8/2000 | Sazzad et al. | 704/229 |
| 6,289,486 | B1 * | 9/2001 | Lee et al. | 714/788 |
| 6,304,991 | B1 | 10/2001 | Rowitvch et al. | |
| 6,334,197 | B1 | 12/2001 | Eroz et al. | |
| 6,374,386 | B1 | 4/2002 | Kim et al. | |
| 6,487,693 | B1 | 11/2002 | Kim et al. | |
| 6,530,059 | B1 * | 3/2003 | Crozier et al. | 714/786 |
| 6,704,370 | B1 * | 3/2004 | Chheda et al. | 375/299 |

FOREIGN PATENT DOCUMENTS

| | | |
|---|---|---|
| KR | 1997-36265 | 7/1997 |
| KR | 1997-60101 | 11/1997 |
| KR | KPA 18560 | 5/1999 |
| RU | 2089045 | 8/1997 |

(Continued)

OTHER PUBLICATIONS

Translation of KPA 18560, 1999, Korea (43 pp.).

(Continued)

*Primary Examiner* — David Ton
(74) *Attorney, Agent, or Firm* — The Farrell Law Firm, P.C.

(57) ABSTRACT

A 2-dimensional interleaving method is disclosed. The method comprises dividing a frame of input information bits into a plurality of groups and sequentially storing the divided groups in a memory; permuting the information bits of the groups according to a given rule and shifting an information bit existing at the last position of the last group to a position preceding the last position; and selecting the groups according to a predetermined order, and selecting one of the information bits in the selected group.

26 Claims, 11 Drawing Sheets

FOREIGN PATENT DOCUMENTS

| | | |
|---|---|---|
| WO | WO 98/11671 | 3/1998 |
| WO | WO 99/12265 | 3/1999 |
| WO | KR00/00504 | 3/2000 |
| WO | WO 00/70771 | 11/2000 |
| WO | KR00/00504 | 1/2001 |

OTHER PUBLICATIONS

Heegard, C., et al., Turbo Coding, Kluwer Int'l, 1999 (228 pp.).
Dolinar, S., et al; Weight Distributions for Turbo Codes Using Random and Nonrandom Permutations; TDA Progress Report 42-122, pp. 56-65, Aug. 1995 (10 pp.).
TSG-RAN Working Group1 meeting #2; A Low Complexity and Flexible Turbo Interleaver with Good Performance; Yokohama 22-25, Feb. 1999 (7 pp.).
Brayer K., et al; Evaluation of Error Correction Block Encoding for High-Speed HF Data; IEEE Transactions On Communication Technology; vol. Com-15, No. 3, 371-382; Jun. 1967 (12 pp.).
Brayer, K.; The Improvement of Digital HF Communication Through Coding: I—Interleaved Cyclic Coding; IEEE, vol. Com-16, No. 6, 771-778, Dec. 1968 (8 pp.).
Electronics Letters; Pages cover and 1547-1548; IEE vol. 25 No. 22, Oct. 1989 (3 pp.).
Technical Specification TS 25.212 V2.0.0 (1996-06); 3rd Generation Partnership Project (3GPP) (38 pp.).
Technical Specification TS 25.212 V1.0.0 (1999-04); 3rd Generation Partnership Project (3GPP) (40 pp.).
Technical Specification TS 25.212 v6.0.0 (2003-12); 3rd Generation Partnership Project (3GPP) (76 pp.).
TSG-RAN Working Group1 meeting #3, Nynashamn, Sweden, 22-26 Mar. 1999; Report from Ad Hoc5, Mar. 24, 1999 (4 pp.).
Transcript (20 pp, containing pp. 1-46 (manuscript) and index) of Deposition of Douglas Neal Rowtich, Dec. 5, 2006.
Kenneth Brayer et al.; Evaulation of Error Correction Block Encoding for High-Speed HF Data; IEEE; vol. Com-15, No. 3; Jun. 1967.
Kenneth Brayer; The Improvement of Digital HF Communication Through Coding: I—Interleaved Cyclic Coding; IEEE; vol. Com-16, No. 6; Dec. 1968.
Melanie L. Kirkman; Videotaped Deposition Of Douglas Neal Rowitch; Henjum Goucher Reporting Services, L.P.; pp. 1-53, Dec. 5, 2006.
*Ericsson Inc.* v. *Samsung Electronics Co., Ltd.*, Civil Action No. 2:06-CV-00063-TJW; Document 13-1; pp. 1-27, May 15, 2006.
Complaint of Samsung Telecommunications America LLP under Section 337 of the Tariff Act of 1930 before the International Trade Commission (ITC) (28 pp.), Jun. 2, 2006.
Amended Response in ITC Action (54 pp), Aug. 29, 2006.
Answer, Affirmative Defenses in Texas Action (27 pp), May 15, 2005.
Reply in Texas Action (32 pp), Jun. 29, 2006.
Order granting stay in Texas Action (2 pp), Dec. 7, 2006.
Expert Report of Dr. Stephen B. Wicker regarding Invalidity of U.S. Patents Nos. 6,598,202 (143 pp), Jan. 26, 2007.
Respondent's Prehearing Statement (122 pp), 2007.
Respondent's Submissions in Response to Order No. 56, Item 2, Paragraphs 16-26 (44 pp), 2007.
Memorandum in Support of Complainant's Motion to Supplement Complainant's Prehearing Statement to Respond to Respondent's New Technical Arguments (13 pp), 2007.
Pre-hearing Statement of Complainants Samsung Telecommunications America LLP and Samsung Electronics Co. (57 pp), May 4, 2007.
Commission Investigative Staffs Pre-Hearing Brief (14 pp), May 15, 2007.
Complaint's Educational Submission Pursuant to Order No. 56 (6 pp), May 21, 2007.
Ericsson Inc., Telefonaktiebolaget LM Ericsson, Sony Ericsson Mobile Communications AB, And Sony Ericsson Mobile Communications (USA) Inc.'s Second Supplemental Respons (20pp), Jan. 12, 2007.
Supplemental Rebuttal Expert Report of Dr. Stephen B. Wicker Regarding . . . And Comments on U.S. Patent No. 6,598,202 (16 pp), Apr. 6, 2007.
Expert Report of Richard Dale Wesel RE: U.S. Patent No. 6,598,202 (17 pp), 2007.
Decision on Grant From Russian Patent Office With Translation 2002.
Oscar Y. Takeshita, et al: New Classes of Algebraic Interleavers for Turbo-Codes; Information Theory, IEEE. Proceedings, 1998, p. 419.
Eric K. Hall, et al: Stream-Oriented Turbo Codes; Vehicular Technology Conference. 1998 vol. 1, pp. 71-75.
International Search Report in PCT/KR00/00504 (3pages), 2000.
Motorola, "Complexity Analysis of the Motorola Turbo Code Interleaver", TSG-RAN Working Group 1 meeting #3, XP002194524, Mar. 22-26, 1999.
He et al., "Interleaver Design for Turbo Codes", International Conference on Information, Communications and Signal Processing, Sep. 9-12, 1997.
Li et al., "Flattening Effect of Turbo Codes under Non-Terminated Conditions", Electronic Letters, Dec. 10, 1998, vol. 34, No. 25.
Robertson, "Improving Decoder and Code Structure of Parallel Concatenated Recursive Systematic (Turbo) Codes", Sep. 1994.
Nortel Networks: Low Complexity Alebraic Interleaver for UTRA Turbo Codes, ETSI SMG2 UMTS L1 Expert Group, Meeting #10, Espoo, Finland, Jan. 18-20, 1999.
Heegard et al., "Turbo Coding", 1999.
Berrou et al., "Near Shannon Limit Error-Correcting Coding and Decoding: Turbo Codes (1)", 1993.

* cited by examiner

TURBO INTERLEAVING APPARATUS AND METHOD

Matter enclosed in heavy brackets [ ] appears in the original patent but forms no part of this reissue specification; matter printed in italics indicates the additions made by reissue.

PRIORITY

This application claims priority to an application entitled "Turbo Interleaving Apparatus and Method" filed in the Korean Industrial Property Office on May 19, 1999 and assigned Serial No. 99-18928 and an application filed in the Korean Industrial Property Office on May 21, 1999 and assigned Serial No. 99-18560, the contents of which are hereby incorporated by reference.

BACKGROUND OF THE INVENTION

1. Field of the Invention

The present invention relates generally to a turbo encoder used for radio communication systems (including satellite, ISDN, digital cellular, W-CDMA, and IMT-2000 systems), and in particular, to an internal interleaver of a turbo encoder.

2. Description of the Related Art

In general, an interleaver used for a turbo encoder randomizes an address of input information word and improves a distance property of a codeword. In particular, it has been decided that a turbo code will be used in a supplemental channel (or data transmission channel) of IMT-2000 (or CDMA-2000) and IS-95C air interfaces and in a data channel of UMTS (Universal Mobile Telecommunication System) proposed by ETSI (European Telecommunication Standards Institute). Thus, a method for embodying an interleaver for this purpose is required. In addition, the invention relates to an error correction code which greatly affects performance improvement of the existing and future digital communication systems.

For an existing internal interleaver for a turbo encoder (hereinafter, referred to as a turbo interleaver), there have been proposed various interleavers such as PN (Pseudo Noise) random interleaver, random interleaver, block interleaver, non-linear interleaver, and S-random interleaver. However, so far, such interleavers are mere algorithms designed to improve their performances in terms of scientific researches rather than implementation. Therefore, when implementing an actual system, the hardware implementation complexity must be taken into consideration. A description will now be made of properties and problems associated with the conventional interleaver for the turbo encoder.

Performance of the turbo encoder is dependent upon its internal interleaver. In general, an increase in the input frame size (i.e., the number of information bits included in one frame) enhances the effectiveness of the turbo encoder. However, an increase in interleaver size causes a geometric increase in calculations. Therefore, in general, it is not possible to implement the interleaver for the large frame size.

Therefore, in general, the interleavers are implemented by determining conditions satisfying several given criteria. The criteria are as follows:

Distance Property: The distance between adjacent codeword symbols should be maintained to a certain extent. This has the same function as a codeword distance property of the convolutional code, and as a criterion indicating this, a minimum free distance is used which is a value of a codeword path or a codeword sequence with the minimum Hamming weight out of the code symbol sequences (or codeword paths) output on the trellis. In general, it is preferable that the interleaver should be designed to have the longer free distance, if possible.

Random Property: A correlation factor between output word symbols after interleaving should be much lower than a correlation factor between original input word symbols before interleaving. That is, randomization between the output word symbols should be completely performed. This makes a direct effect on the quality of extrinsic information generated in continuous decoding.

Although the above criteria are applicable to a general turbo interleaver, it is difficult to clearly analyze the properties when the interleaver increases in size.

In addition, another problem occurring when designing the turbo interleaver is that the minimum free distance of the turbo code varies according to the type of the input codeword. That is, when the input information word has a specific sequence pattern defined as a critical information sequence pattern (CISP), the free distance of the output code symbols generated from the turbo encoder has a very small value. If the input information word has a Hamming weight 2, the CISP occurs when the input information word has two information bits of '1' and can also occur when the input information word has 3 or more information bits of '1'. However, in most cases, when the input information word has 2 information bits of '1', the minimum free distance is formed and most error events occur in this condition. Therefore, when designing the turbo interleaver, an analysis is generally made on the case where the input information word has the Hamming weight 2. A reason that the CISP exists is because the turbo encoder generally uses RSC (Recursive Systematic Convolutional Codes) encoders for the component encoders shown in FIG. 1 (described further below). To improve performance of the turbo encoder, a primitive polynomial should be used for a feedback polynomial (gf(x) of FIG. 1) out of the generator polynomials for the component encoder. Therefore, when the number of the memories of the RSC encoder is m, a feedback sequence generated by the feedback polynomial continuously repeats the same pattern at a period of $2^m-1$. Therefore, if an input information word '1' is received at the instance corresponding to this period, the same information bits are exclusive-ORed, so that the state of the RSC encoder becomes an all-zero state henceforth, thus generating the output symbols of all 0's. This means that the Hamming weight of the codeword generated by the RSC encoder has a constant value after this event. That is, the free distance of the turbo code is maintained after this time, and the CISP becomes a main cause of a reduction in the free distance of the turbo encoder, whereas, as noted above, a larger free distance is desirable.

In this case (in the prior art of turbo interleaver), to increase the free distance, the turbo interleaver randomly disperses the CISP input information word so as to prevent a decrease in the free distance at the output symbol of the other component RSC encoder.

The above-stated properties are fundamental features of the known turbo interleaver. However, for the CISP, it is conventional that the information word has the minimum Hamming weight, when the input information word has the Hamming weight 2. In other words, the fact that the CISP can be generated even when the input information word has the Hamming weight 1 (i.e., when the input information word has one information bit of '1') was overlooked, when the information word input to the turbo encoder had the type of a block comprised of frames.

For example, a prime interleaver (PIL) designated as the working model of the turbo code interleaver specified by the present UMTS standard exhibits such problems, thus having a degraded free distance property. That is, the implementation algorithm of the model PIL turbo interleaver include 3 stages, of which the second stage, which plays the most important role, performs random permutation on the information bits of the respective groups. The second stage is divided into three cases of Case A, Case B and Case C, and the Case B always involves the case where the free distance is decreased due to the event where the input information word has the Hamming weight 1. In addition, even the Case C involves a possibility that such an event will occur. The detailed problems will be described later with reference to the PIL.

In conclusion, when various interleaver sizes are required and the hardware implementation complexity is limited in the IMT-2000 or UMTS system, the turbo interleaver should be designed to guarantee the optimal interleaver performance by taking the limitations into consideration. That is, the required interleaver should be able to guarantee uniform performance for the various interleaver sizes, while satisfying the above-stated properties. More recently, there have been proposed several types of the interleavers for a PCCC (Parallel Concatenated Convolutional Codes) turbo interleaver, and a LCS (Linear Congruential Sequence) turbo interleaver has been provisionally decided as the turbo interleaver in the IMT-2000 (or CDMA-2000) and IS-95C specifications. However, most of these turbo interleavers have the problems of the CSIP with Hamming weight 1, and the details of implementing these turbo interleavers are still not defined. Therefore, the present invention proposes a solution of the turbo interleaver's problems, and a new method for implementing the turbo interleaver. In addition, the invention shows the PIL interleaver which is a working assumption of the UMTS turbo interleaver, and proposes a solution of this interleaver's problem.

To sum up, the prior art has the following disadvantages.

(1) The turbo interleaver is designed for the infinite frame size on the basis of the CISP for which the input information word has the Hamming weight 2, without considering the fact that determining the CISP according to the type of the input information word is limited to the frame size. However, in an actual system, the frame has a finite size, thus causing a decrease in the free distance of the turbo code.

(2) In designing the existing turbo interleaver, the fact that the input information word may have Hamming weight 1 was not considered. In other words, for the finite frame size, the turbo interleaver design rule should be determined in consideration of the fact that the minimum free distance generated in the PCCC turbo encoder is determined by the CISP having the Hamming weight 1. However, this was not fully considered for the existing turbo interleavers.

(3) The Prime interleaver (PIL) designated as the working assumption of the turbo code interleaver defined by the UMTS specification involves such problems, thus having degraded free distance performance.

SUMMARY OF THE INVENTION

It is, therefore, an object of the present invention to provide an interleaving device and method for analyzing properties of a turbo interleaver and a property of a critical information sequence pattern (CISP) to improve performance of the turbo interleaver.

It is another object of the present invention to provide an interleaving device and method for improving free distance performance of a turbo code for the case where an input information word has a Hamming weight 1 when the information word input to a turbo interleaver has a block type comprised of frames.

It is a further object of the present invention to provide an interleaving device and method for solving the problem that the free distance is decreased when an input information word has a Hamming weight 1 in a prime interleaver (PIL) that is the turbo interleaver specified in the UMTS specification.

To achieve the above objects, there is provided a 2-dimensional interleaving method comprising dividing a frame of input information bits into a plurality of groups and sequentially storing the divided groups in a memory; permuting the information bits of the groups according to a given rule and shifting an information bit existing at the last position of the last group to a position preceding the last position; and selecting the groups according to a predetermined order, and selecting one of the information bits in the selected group.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Prior to describing the invention, the specification will present the problems occurring when an input information word, which is one of the design criteria used in the existing turbo interleaver/deinterleaver, is processed on a frame unit basis, and then analyze an affect that the CISP with a Hamming weight 1 has on the Hamming weight of the output code symbols. Next, the specification will propose a method for solving the problems and verify the performance difference through analysis of the minimum free distance.

Figure 1:
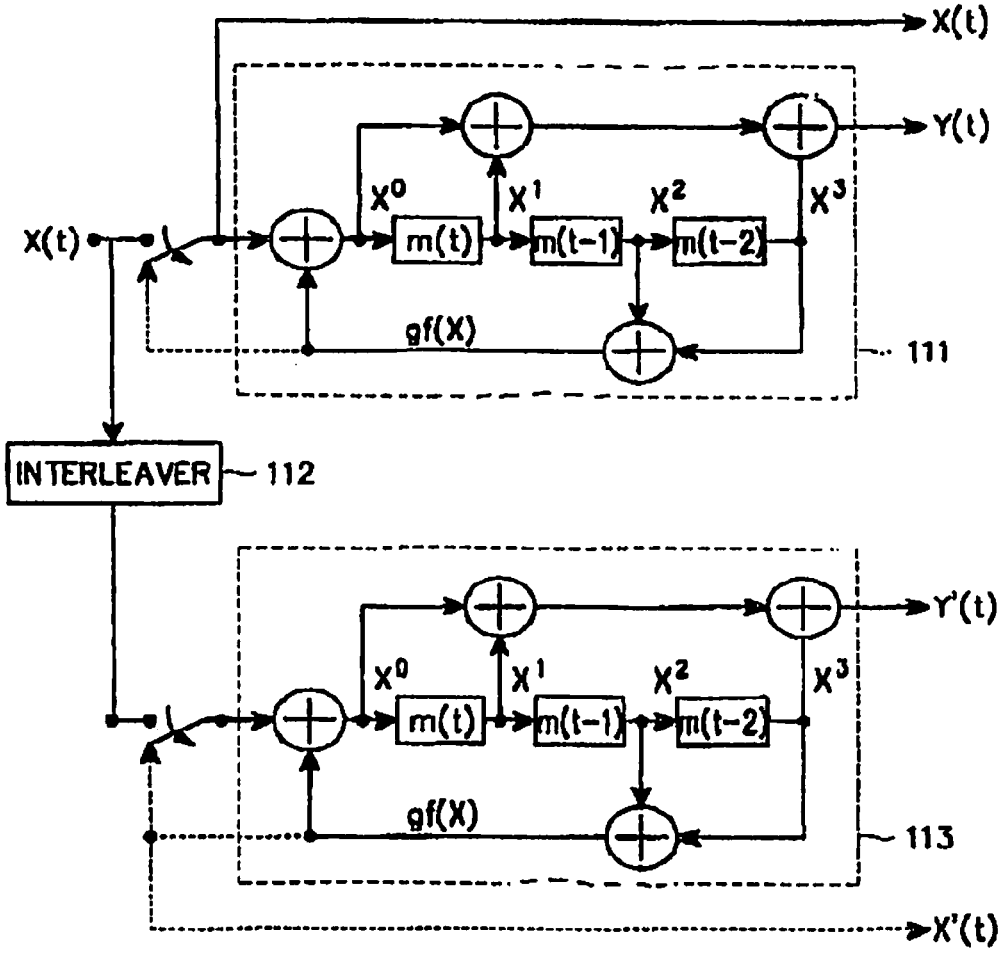
FIG. 1 (PRIOR ART)
FIG. 1 is a diagram illustrating a general parallel turbo encoder.

FIG. 1 shows a structure of a general parallel turbo encoder, which is disclosed in detail in U.S. Pat. No. [5,446,474] *5,446,747*, issued on Aug. 29, 1995, which is hereby incorporated by reference.

Referring to FIG. 1, the turbo encoder includes a first component encoder 111 for encoding input frame data, an interleaver 112 for interleaving the input frame data, and a second component encoder 113 for encoding an output of the interleaver 112. A known RSC (Recursive Systematic Convolutional CODES) encoder is typically used for the first and second component encoders 111 and 113. Hereinafter, the first RSC component encoder 111 will be referred to as RSC1 and the second RSC component encoder 113 will be referred to as RSC2. Further, the interleaver 112 has the same size as the input information bit frame, and rearranges the sequence of the information bits provided to the second component encoder 113 to reduce a correlation between the information bits.

Figure 2:
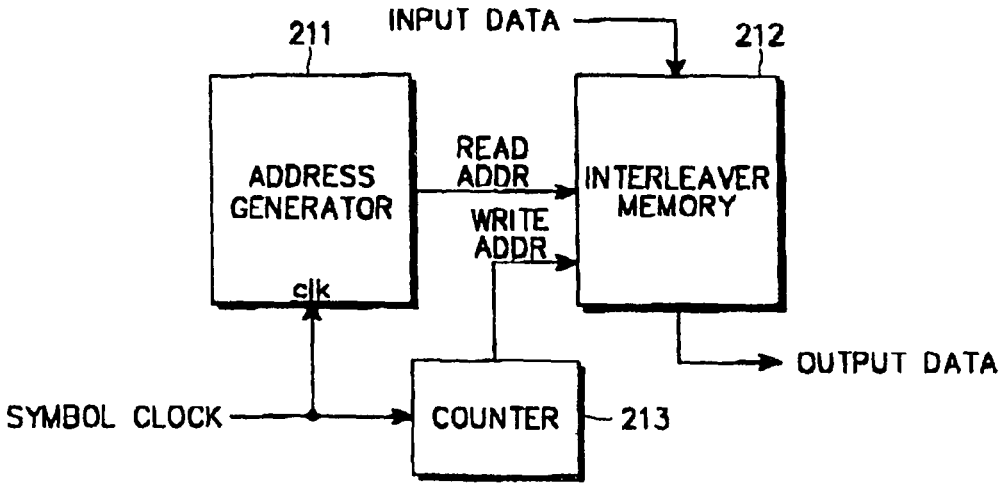
FIG. 2 is a diagram illustrating a general interleaver.
Figure 3:
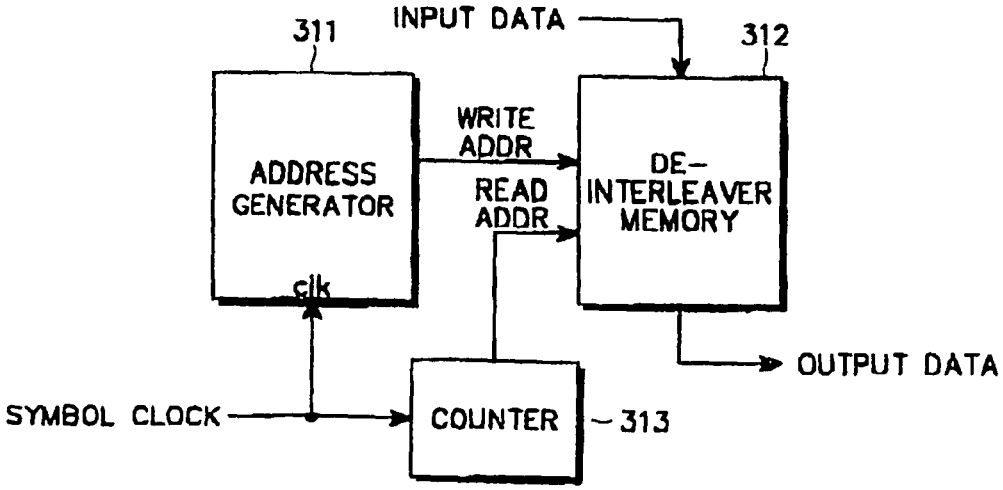
FIG. 3 is a diagram illustrating a general deinterleaver.

FIGS. 2 and 3 show fundamental structures of the general interleaver and deinterleaver, respectively.

Referring to FIG. 2, an interleaver for interleaving frame data output from the first component encoder will be described. An address generator 211 generates a read address for changing the sequence of input data bits according to an input frame data size L and an input clock, and provides an interleaver memory 212 with the generated read address. The interleaver memory 212 sequentially stores input data in a write mode of operation, and outputs the stored data according to the read address provided from the address generator 211 in a read mode of operation. A counter 213 counts the input clock and provides the clock count value to the interleaver memory 212 as a write address. As describe above, the interleaver sequentially stores input data in the interleaver memory 212 in the write mode of operation, and outputs the data stored in the interleaver memory 212 according to the read address provided from the address generator 211 in the read mode of operation. Alternatively, it is also possible to change the sequence of the input data bits before storing them in the interleaver memory in the write mode of operation, and sequentially read the stored data in the read mode of operation.

Referring to FIG. 3, a deinterleaver will be described. An address generator 311 generates a write address for restoring the sequence of input data bits to the original sequence according to an input frame data size L and an input clock, and provides a deinterleaver memory 312 with the generated write address. The deinterleaver memory 312 stores input data according to the write address provided from the address generator 311 in the write mode of operation, and sequentially outputs the stored data in the read mode of operation. A counter 313 counts the input clock and provides the clock count value to the deinterleaver memory 312 as a read address. As described above, the deinterleaver has the same structure as the interleaver but has the reverse operation of the interleaver. The deinterleaver is merely different from the interleaver in that the input data has different sequences in both the read and write modes. Therefore, for convenience, the description below will be made with reference to the interleaver only.

In general, since the turbo code is a linear block code, a new information word obtained by adding a non-zero information word to an input information word has the same codeword distribution property. Therefore, even though the property is developed based on the all-zero information word, the same performance will be given as compared with the performance determined using the non-zero information word. Thus, a description below will be made with reference to the case where the input information word is the all-zero codeword. That is, performance of the turbo code will be analyzed on the assumption that the input information word has all zero bits and only a given information bit is '1'.

To improve performance of the turbo encoder, a primitive polynomial may be used for a feedback polynomial out of a generator polynomial for the component encoder. The feedback polynomial is given by expressing tapping which undergoes feedback in the RSC component encoders 111, 113 of FIG. 1 in a polynomial, and the feedback polynomial is defined as gf(x). If FIG. 1, $gf(x)=1+x^2+x^3$. That is, the highest order indicates the depth of a memory, and the rightmost connection determines whether the coefficient $x^3$ of gf(x) is 0 or 1. Therefore, when the number of the memories for the RSC encoder is m, a feedback sequence generated by the feedback polynomial continuously repeats the same pattern at a period of $2^m-1$. Thus, when an input information word '1' is received at the instant corresponding to this period (e.g., for m=3, when an input information word of '10000001 . . . ' is received), the same information bits are exclusive-ORed, so that the state of the RSC encoder becomes an all-zero state henceforth, thus generating the output symbols of all 0's. This means that the Hamming weight of the codeword generated by the RSC encoder has the constant value of 1 after this event. That is, it means that the free distance of the turbo code is maintained after this time, and the CISP becomes a main cause of a reduction in the free distance of the turbo encoder.

In this case, to increase the free distance, the turbo interleaver randomly disperses the CISP input information word so as to prevent a decrease in the free distance at the output symbol of the other component RSC encoder. Table 1 below shows a feedback sequence generated from $gf(x)=1+x^2+x^3$. In Table 1, X(t) indicates an input information bit at a time t of the input information word. Further, m(t), m(t−1) and m(t−2) indicate 3 memory states of the RSC encoder, respectively. Here, since the number of memories is 3, the period is $2^3-1=7$.

TABLE 1

| m(t) | m(t − 1) | m(t − 2) | | |
|---|---|---|---|---|
| 1 | 0 | 0 | t = 0 | X(0) = 1 |
| 0 | 1 | 0 | t = 1 | X(1) = 0 |
| 1 | 0 | 1 | t = 2 | X(2) = 0 |
| 1 | 1 | 0 | t = 3 | X(3) = 0 |
| 1 | 1 | 1 | t = 4 | X(4) = 0 |
| 0 | 1 | 1 | t = 5 | X(5) = 0 |
| 0 | 0 | 1 | t = 6 | X(6) = 0 |
| 1 | 0 | 0 | t = 7 | if X(7) = 1 |
| 0 | 0 | 0 | t = 8 | |
| 0 | 0 | 0 | t = 9 | |
| | | . . . | | |
| | | . . . | | |

From Table 1, it is noted that if X(t)=1 at time t=7, then m(t), m(t−1) and m(t−2) become all zero states henceforth. Therefore, the Hamming weight of the following output symbols becomes always zero. In this case, if the turbo interleaver provides the RSC2 with the input information sequence '10000001000 . . . ' as it is, the Hamming weight of the output symbols at the following time of t=7 will not change thereafter even in the RSC2 using the same feedback polynomial, for the same reason. This causes a decrease in the free distance of the whole output symbols of the turbo encoder. To prevent this, the turbo interleaver changes the original input information sequence '10000001000 . . . ' to an input information sequence of a different pattern (for example, changes a position of the information bit '1' such as 110000000 . . . ) and provides the resulting sequence to the RSC2. Therefore, even though an increase in the Hamming weight is stopped in the RSC1, the Hamming weight continuously increases in the RSC2, so that the total free distance of the turbo encoder increases. This is because the feedback polynomial, having the infinite impulse response (IIR) filter type, continuously IN generates the infinite output symbol '1' even for one input information bit '1'. Equation 1 below shows the relationship between the RSC1 and the RSC2 in terms of the Hamming weight or free distance of the turbo encoder.

$$\text{HW(Output code sequence)}=\text{HW(RSC1 code sequence)}+\text{HW(RSC2 code sequence)} \quad \text{[Equation 1]}$$

where HW is the Hamming weight.

From Equation 1, it is noted that a Hamming weight balance between RSC1 and RSC2 is very important. In particular, it is noted that the minimum free distance of the turbo code is generated for the minimum Hamming weight of the input information word, when the IIR (Infinite Impulse Response) characteristic of the RSC encoder is taken into consideration. In general, the minimum free distance is provided when the input information word has the Hamming weight 2, as mentioned above.

However, as described above, the minimum free distance occurs when the input information word has the Hamming weight 3, 4, 5 . . . , as well as when the input information word has the Hamming weight 2. This occurs when the input information word is received on a frame unit basis, as follows.

For example, when only the information bit located at the last position of the input information word, i.e., the last position of the frame, is '1' and all the other information bits are 0's, the Hamming weight of the input information word becomes 1. In this case, the number of the symbols '1' output from the RSC1 becomes very small, because there is no more input information word. Of course, when zero-tail bits are used, there exist two symbols but those are independently used rather than undergoing turbo interleaving. Therefore, it is assumed herein that the weight is slightly increased. Since the constant weight is added, this will be so excluded from an analysis of the interleaver. In this case, it is noted from Equation 1 that the RSC2 should generate a great number of the output symbols '1' to increase the total free distance.

Now, with reference to FIGS. 4 to 10, a description will be comparatively made regarding the problems of the prior art and the solutions of the problems.

In FIGS. 4 to 10, the cross-hatching parts indicate the positions where the input information bit is '1', and the other parts indicate the positions where the input information bit is '0'.

Figure 4:
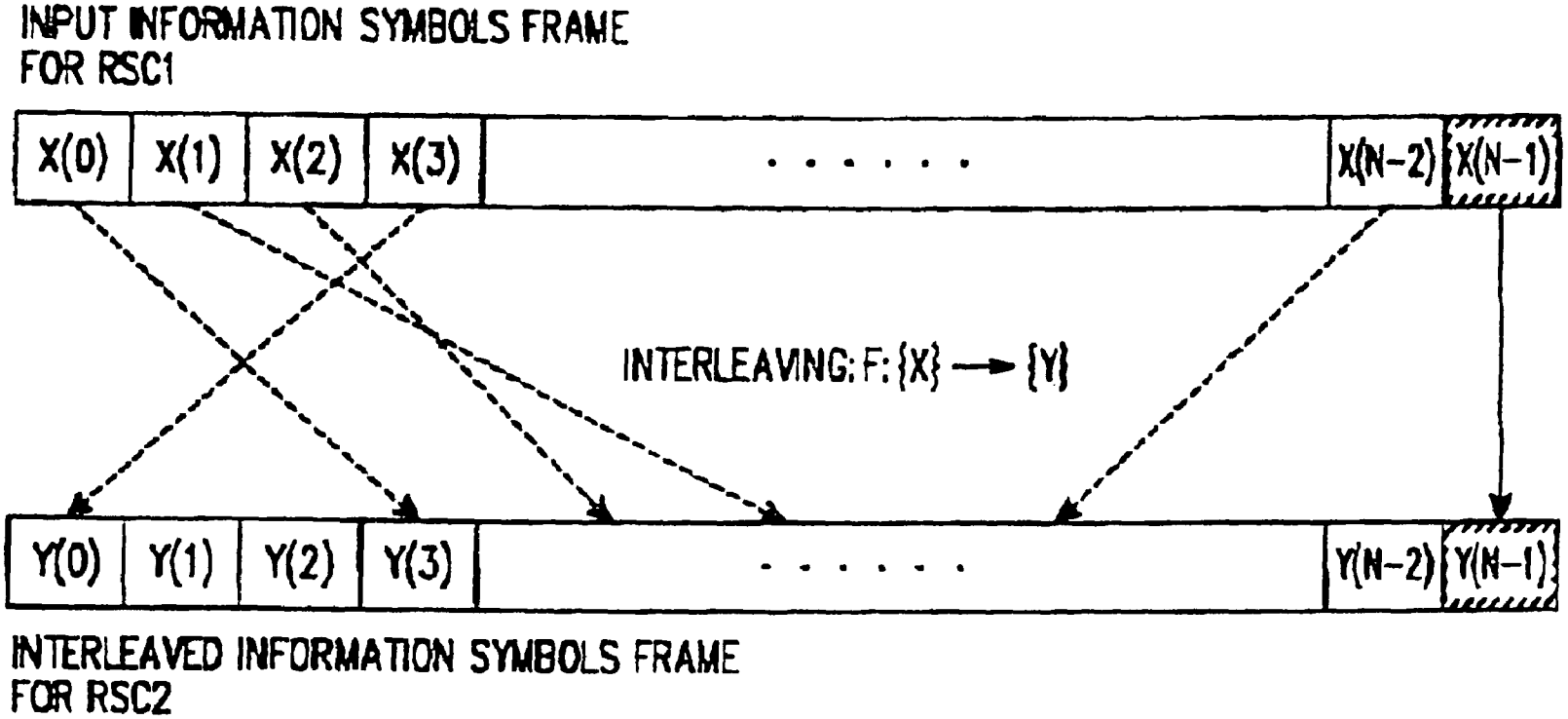
FIG. 4 is a diagram illustrating a method for generating a critical information sequence pattern (CISP) in a turbo interleaver.
Figure 5:
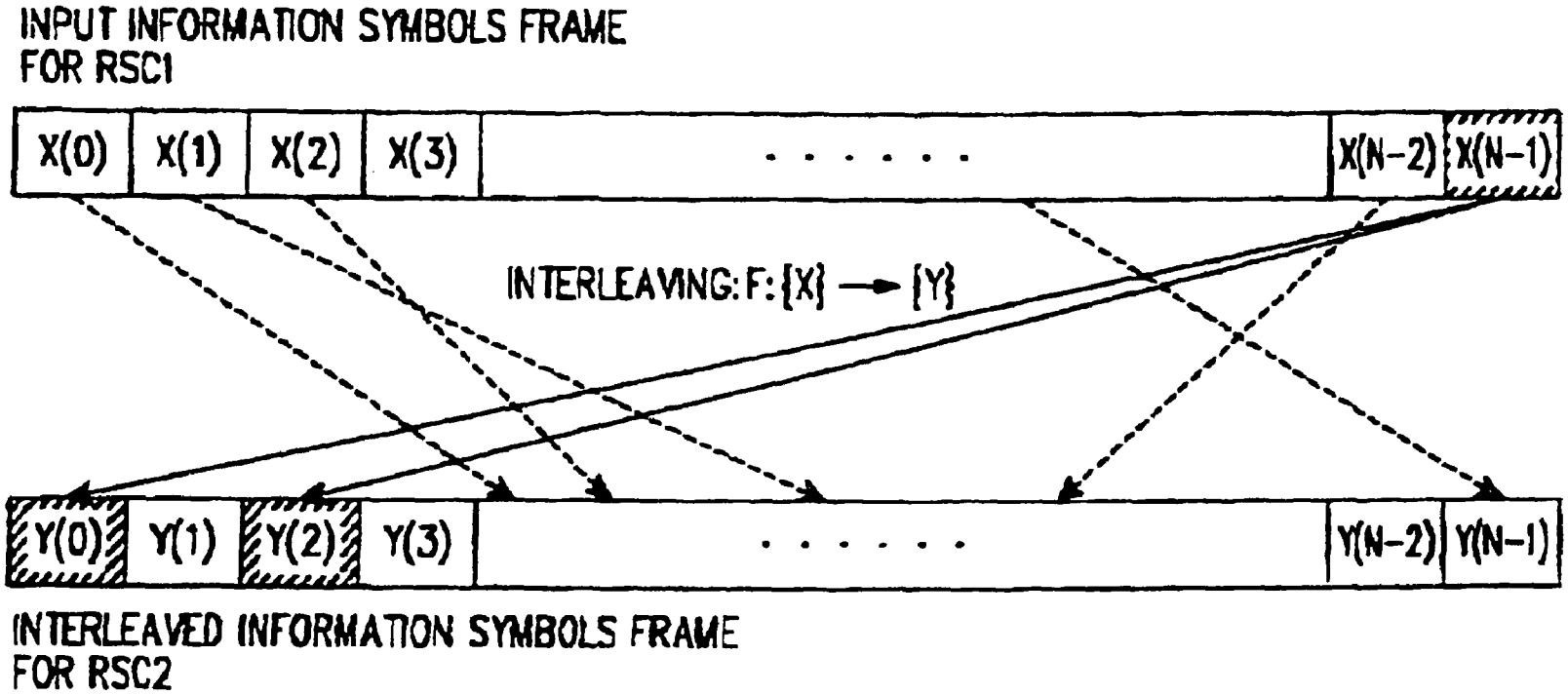
FIG. 5 is a diagram illustrating another method for generating the CISP in the turbo interleaver.

If, as shown in FIG. 4, the turbo interleaver shifts (or permutes) the position of the input information word, where the original symbol of the RSC1 is '1', to the last position of the frame after interleaving, the number of the output symbols '1' generated from the RSC2 will be very small. In this case, since the RSC1 and the RSC2 generate a very small number of the output symbols '1' in accordance with Equation 1, the total free distance decreases drastically. However, if, as shown in FIG. 5, the turbo interleaver shifts the position of the input information word, where the original symbol of the RSC1 is '1', to the first position or a position near the leading position of the frame after interleaving, the number of the output symbols '1' generated from the RSC2 will be increased. This is because a plurality of symbols '1' are output through (N−h) state transitions of the RSC2 encoder, where N is the interleaver size and h is a number of '1'. In this case, the RSC2 generates a great number of the output symbols '1', thereby increasing the total free distance.

Figure 6:
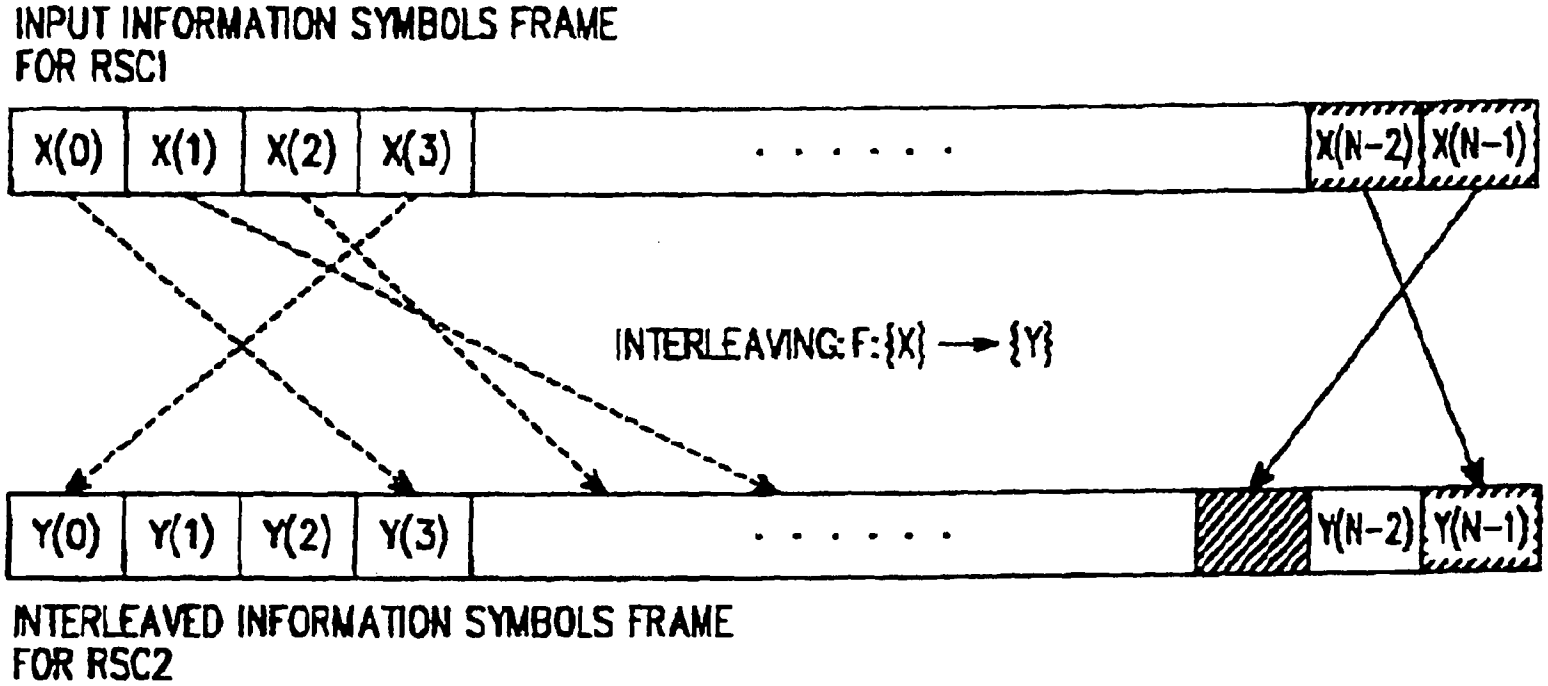
FIG. 6 is a diagram illustrating a method for solving a problem occurring when generating the CISP of FIG. 4.

In addition to the decreased free distance occurring when the internal interleaver shifts the input information bit '1' located at the last position of the frame to the last position of the frame as show in FIG. 4, if one of two information bits of '1' located at the ending position of the frame are still located at (or near) the ending position of the frame even after interleaving as shown in FIG. 6, the total free distance will decrease.

Figure 7:
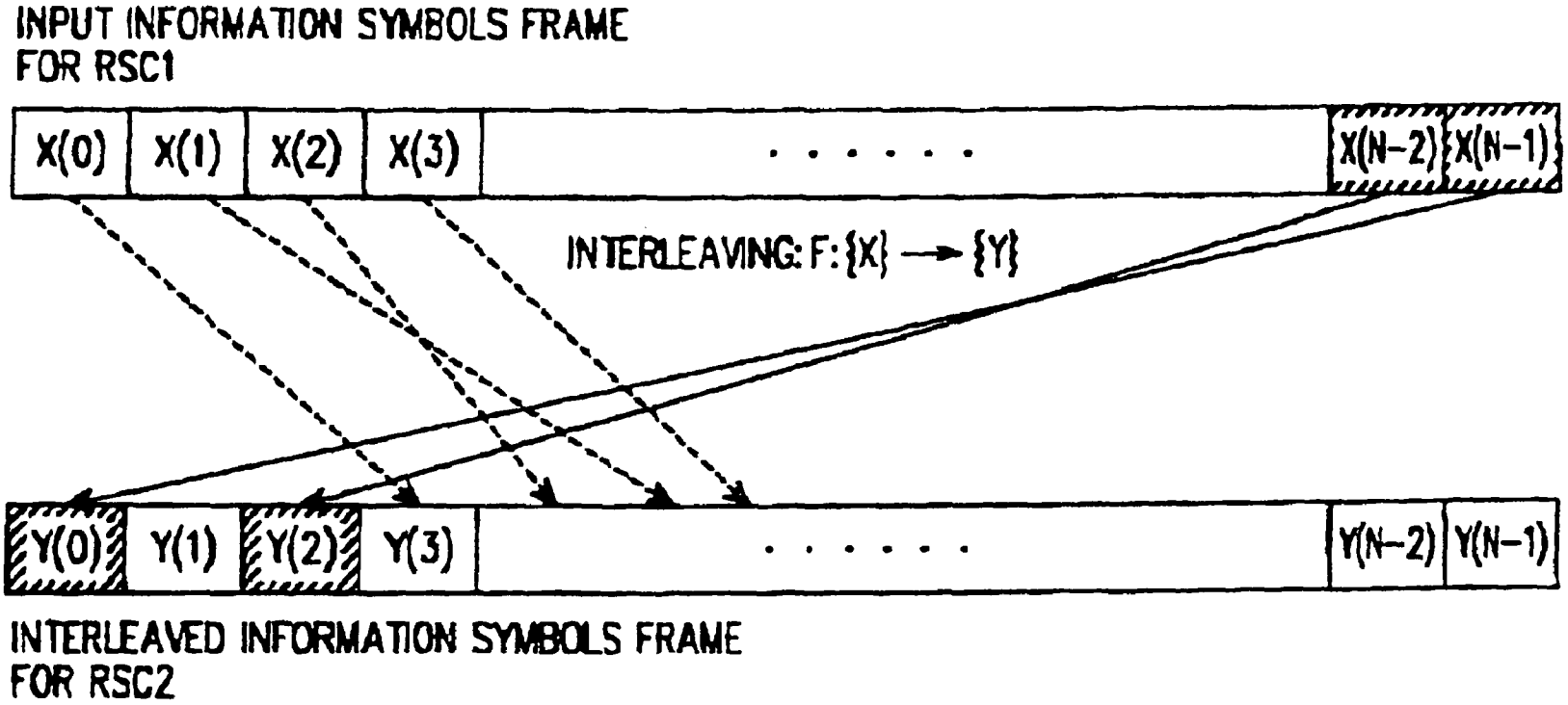
FIG. 7 is a diagram illustrating a method for solving a problem occurring when generating the CISP of FIG. 5.

For example, if the internal interleaver operations in the frame mode shown in FIG. 6 wherein two symbols located at the ending position of the frame are 1's and the other symbols are all 0's, then the Hamming weight of the input information word is 2. Even in this case, the number of the output symbols '1' generated from the RSC1 becomes very small, since there is no more input information bit. Therefore, in accordance with Equation 1, the RSC2 should generate a great number of the output symbols '1' to increase the total free distance. However, if, as shown in FIG. 6, the turbo interleaver shifts the position of the above two symbols to the ending position (or somewhere near to the ending position) of the frame even after interleaving, the RSC2 will also generate a small number of the output symbols '1'. However, if, as shown in FIG. 7, the turbo interleaver shifts the position of the above two symbols to the leading position (or somewhere near the leading position) of the frame, the RSC2 will generate a great number of the symbols '1'. That is, the RSC2 encoder outputs a plurality of the symbols '1' through (N−h) state transitions (N=Interleaver Size, h=a number of symbol '1'). In this case, therefore, the RSC2 generates the increased number of output symbols '1', thereby increasing the total free distance.

Figure 8:
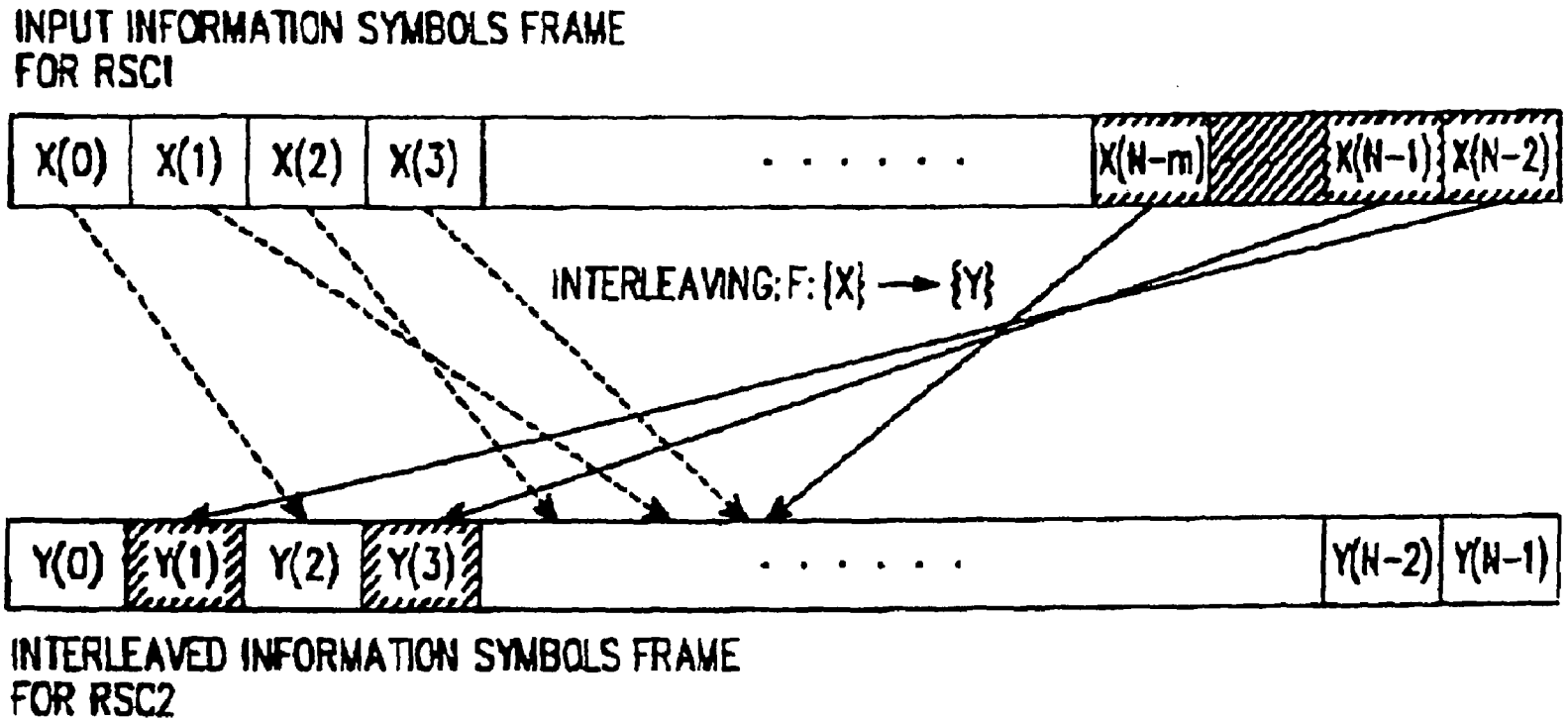
FIG. 8 is a diagram illustrating another method for solving a problem occurring when generating the CISP in the turbo interleaver.

This principle can be expanded to the case where the turbo interleaver operates in the frame mode shown in FIG. 8 wherein a plurality of information bits '1' exist at the ending period (or duration) of the frame and the other information bits are all 0's. Even in this case, the total free distance is increased by shifting the information bits exiting at the ending position of the frame to the leading position of the frame or to positions nearer to the leading position, as shown in FIG. 8. Of course, since the turbo code is the linear block code, even the new information word obtained by adding a non-zero information word to such an information word has the same property. Therefore, a description below will be made on the basis of the all-zero information word.

In conclusion, when designing the turbo interleaver, the following conditions as well as the random property and the distance property should be satisfied to guarantee performance of the turbo decoder and the free distance of the turbo encoder.

Condition 1: In designing every turbo interleaver, the information bits corresponding to a specific period from the last position of the frame should be shifted to the foremost position of the frame by interleaving to increase the free distance of the turbo code.

Condition 2: The information bits corresponding to the last position of the frame should be shifted to a position preceding the last position (if possible, to the leading position of the frame) by interleaving, to increase the free distance of the turbo code.

Figure 9:
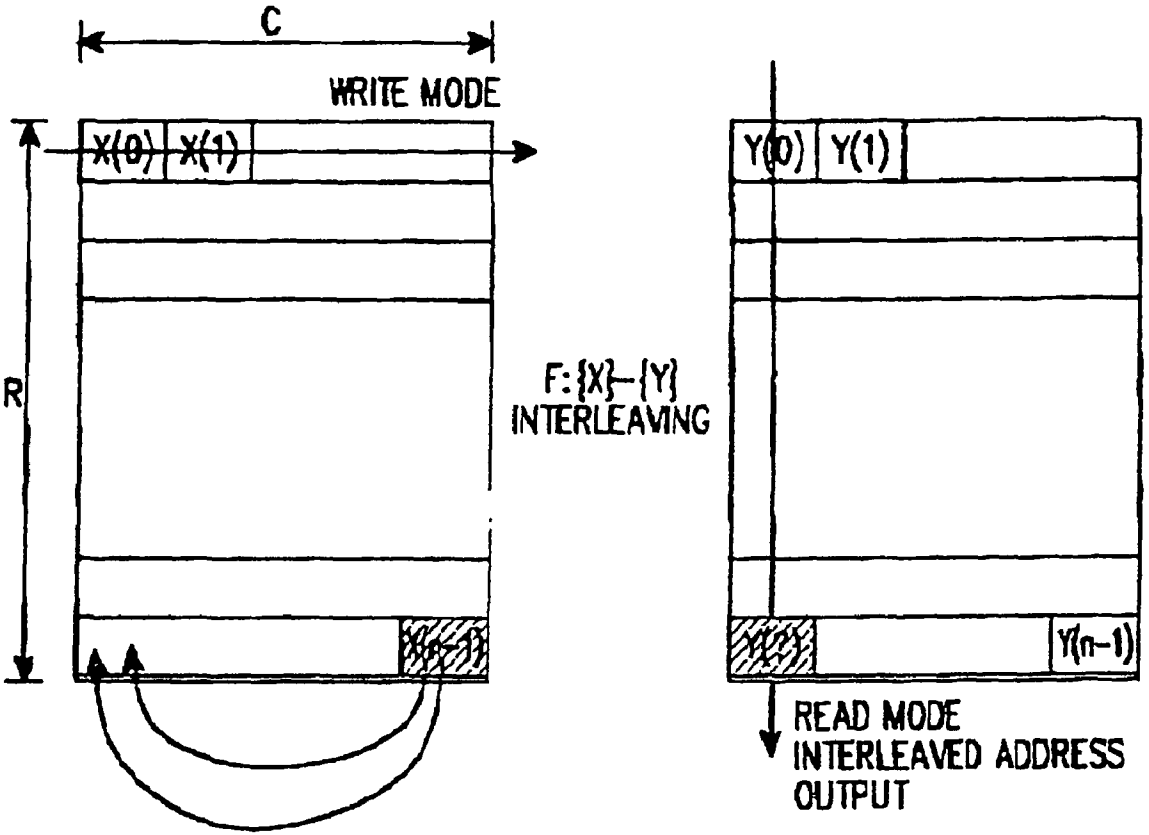
FIG. 9 is a diagram illustrating a method for generating the CISP in a 2-dimensional turbo interleaver.

These conditions are applicable to a 2-dimensional turbo interleaver as well as the above-described 1-dimensional interleaver. The 1-dimensional interleaver performs interleaving, regarding the input information frame as a group, as shown in FIGS. 4 to 8. The 2-dimensional interleaver performs interleaving by dividing the input information frame into a plurality of groups. FIG. 9 shows 2-dimensional interleaving wherein the input information word has the Hamming weight 1.

As illustrated, the input information bits are sequentially written in the respective groups (or rows). That is, the input information bits are sequentially written in the groups (or rows) r0, r1, . . . , r(R−1). In each group, the input information bits are sequentially written from the left to the right. Thereafter, a turbo interleaving algorithm randomly changes the positions of R×C elements (i.e., input information bits), where R is the number of rows, C is the number of columns or, equivalently, the number of information bits in a group. In this case, it is preferable to design the turbo interleaving algorithm such that the information bit located at the last position (or the rightmost position) of the last group should be located at the foremost position, if possible, during output. Of course, depending on the order of selecting the groups, the input information bit located at the last position may be shifted to the foremost position (or close thereto) of the corresponding group. Further, Condition 1 and Condition 2 can be normalized in a k-dimensional turbo interleaver (where k>2) as well as the 2-dimensional interleaver.

Figure 10:
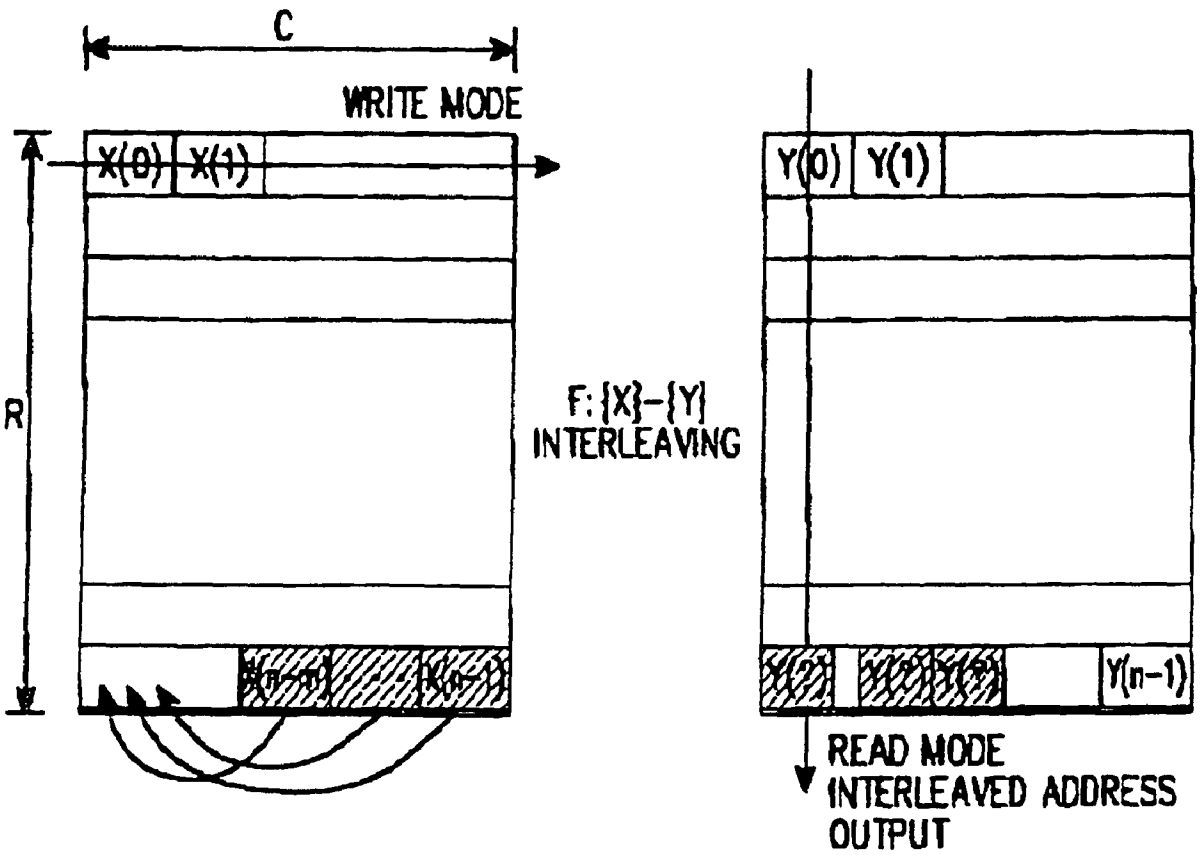
FIG. 10 is a diagram illustrating a method for solving a problem occurring when generating the CISP of FIG. 7.

FIG. 10 shows a case where the input information word has the Hamming weight of over 2. As shown, the information bits located at the last position of the last group are shifted to the leading positions of the last group by interleaving. Of course, the detailed shifting (or interleaving) rule is determined according to an algorithm for a specific interleaver. The invention presents Condition 1 and Condition 2 which should be necessarily satisfied in determining the interleaving rule.

Next, a description will be made of the PIL interleaver having the problems of the prior art *document TS25.212 V1.0.0* (*1999-2000*), and then a further description will be made of a solution of the problems that the PIL interleaver has.

First stage, (1) determine a row number such that R=10 [at the case of] *when* the number of input information bit K is 481 to 530 (*i.e., case* (*1*)) and R=20 [at the case of] *when* the number of input information bit K is any other block length except 481 to 530 (*i.e., case* (*2*)), (2) determine a column number C such that *in* case [1 is] (*1*), C=p=53 where, p=[minimum] prime number, and *in* case [2 is] (*2*), (i) find minimum prime number p [such that,] *satisfying* 0=<(p+1)−K/R (ii) if (0=<p−K/R) then go to (iii), else C=p+1

(iii) if (0=<p−K/R) then C=p=1, else C=p.

A second stage, Case-B, if C=p+1 out of an interleaving algorithm for the PIL interleaver which was provisionally determined as the UMTS turbo interleaver will be first described. In Equation 2 below, R indicates the number of groups (or rows), and has a value of R=10 or R=20. Further, C indicates the size of each group and is determined by [a] *the minimum* prime number p [which is closest to R/K] *satisfying 0=<(p+1)−K/R* determined in Stage 1 according to a value K/R where K is the size of the actual input information bits of a frame. In Case-B, it is always that C=p+1. Therefore, the actual size of the PIL interleaver becomes a value determined by R×C, which is larger than [C] *K*. Further, Cj(i) indicates a position of the information bits obtained by randomly permuting the position of the input information bits in the group on the basis of an ith group, where i=0,1,2,3, . . . , p. In addition, Pj indicates an initial seed value given for [an] *a* jth row vector, and is initially given by the algorithm.

[Equation 2]

B-1) A primitive root g0 is selected from a given random initialization constant table (3GPP TS 25.212 table 2; table of prime *number* p and associated primitive root) such that g0 is [a] *the* primitive root of a field based on *the* prime *number* p.

B-2) Construct base sequence C(i) to be used for row vector randomization is generated using the following formula.

$$C(i)=[g0\times C(i-1)]\bmod p,\ i=1,2,3,\ldots,p-2,\ C(0)=1$$

B-3) Select the minimum prime integer set $\{q_j, j=0,1,2,\ldots,R-1\}$ such that g.c.d $\{q_j, p-1\}=1$, $q_j>6$ and $q_j>q_{(j-1)}$, where g.c.d is a greatest common divider and $q_0=1$ B-4) $\{p_j, j=0,1,2,\ldots,R-1\}$ which is a new prime number set is calculated from $\{q_j, j=0,1,2,\ldots,R-1\}$ such that $p_{P(j)}=q_j$ where, j=0, 1, . . . R−1 and $p_{(j)}$ is the inter-row permutation pattern defined in the third stage.

B-5) Elements of the jth intra-row permutation as following method.

$$C_j(i)=C([i\times p_j]\bmod(p-1)),\ i=0,1,2,3,\ldots,p-2,$$

$$C_j(p-1)=0,$$

and $$C_j(p)=p$$

A third stage, Perform the row-permutation based on the following $p_{(j)}$ (j=0,1,2 . . . , R−1) patterns, where $p_{(j)}$ is the original row position of the j-th permuted row. The usage of these patterns is as follows; when the number of input information bit K is 320 to 480 bit perform group selection pattern $p_A$, when the number of input information bit K is 481 to 530 bit perform group selection pattern $p_c$, when the number of input information bit K is 531 to 2280 bit perform group selection pattern $p_A$, when the number of input information bit K is 2281 to 2480 bit perform group selection pattern $p_B$, when the number of input information bit K is 2481 to 3160 bit perform group selection pattern $p_A$, when the number of input information bit K is 3161 to 3210 bit perform group selection pattern $p_B$, and when the number of input information bit K is 3211 to 5114 bit perform group selection pattern $p_A$. The group selection pattern is as follow;

$p_A$: {19, 9, 14, 4 0, 2, 5, 7, 12, 18, 10, 8, 13, 17, 3, 1, 16, 6, 15, 11} for R=20

$p_B$: {19, 9, 14, 4 0, 2, 5, 7, 12, 18, 16, 13, 17, 15, 3, 1, 6, 11, 8, 10} for R=20

$p_c$: {9,8,7,6,5,4,3,2,1,0} for R=10.

It should be noted herein that the last operation of B-5) is defined as $C_j(p)=p$. That is, this means that when the position of the input information bit before interleaving is p, the position of the input information bit is maintained at the position p even after PIL interleaving. Therefore, for the last group (j=19), the information bits $C_{R-1}(P)=C_{19}(p)$ existing at the last position maintain the same position i=P which is the last position of the 19th group. Therefore, Condition 2 for designing the turbo interleaver is not satisfied.

That is, to solve the problem that the PIL interleaver has, algorithm step B-5) may be modified by performing an additional step after step B-5 as follows. The invention presents six methods of B-5-1) to B-5-6), by way of example. Among these, an optimal performance can be determined through simulations in the light of the properties of the turbo interleaver.

One of the following 6 methods are selected.

B-5-1) Positions of $C_{R-1}$,(0) and $C_{R-1}(p)$ are interchanged. R=10 or 20

B-5-2) Positions of $C_{R-1}(p-1)$ and $C_{R-1}(p)$ are interchanged. R=10 or 20

B-5-3) For every j, positions of $C_j(0)$ and $C_j(p)$ are interchanged. j=0,1,2, . . . , R-1

B-5-4) For every j, positions of $C_j(p-1)$ and $C_j(p)$ are interchanged. j=0,1,2, . . , R−1

B-5-5) For every j, an optimal exchanging position k for the used interleaving algorithm is searched to interchange positions of $C_j(k)$ and $C_j(p)$.

B-5-6) For an (R−1)th row, an optimal exchanging position k for the used interleaving algorithm is searched to interchange positions of $C_{R-1}(k)$ and $C_{R-1}(p)$, where K is determined by simulation.

Figure 11:
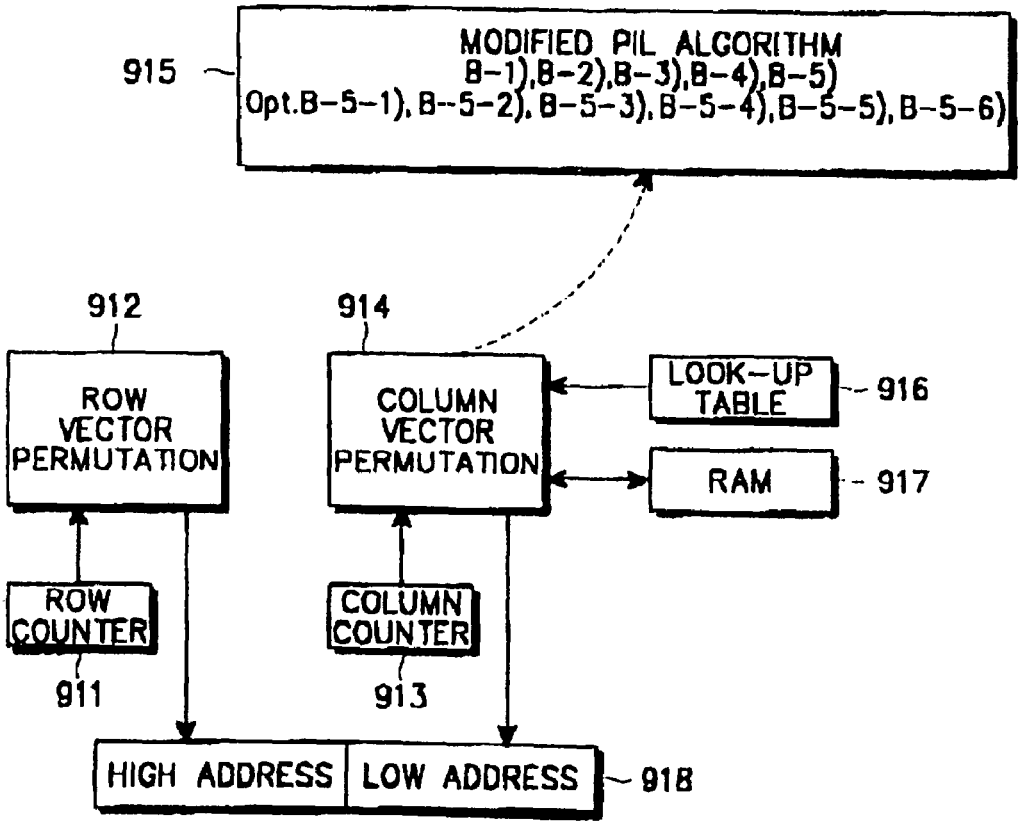
FIG. 11 is a block diagram illustrating an interleaving device for suppressing the CISP according to an embodiment of the present invention.
Figure 12:
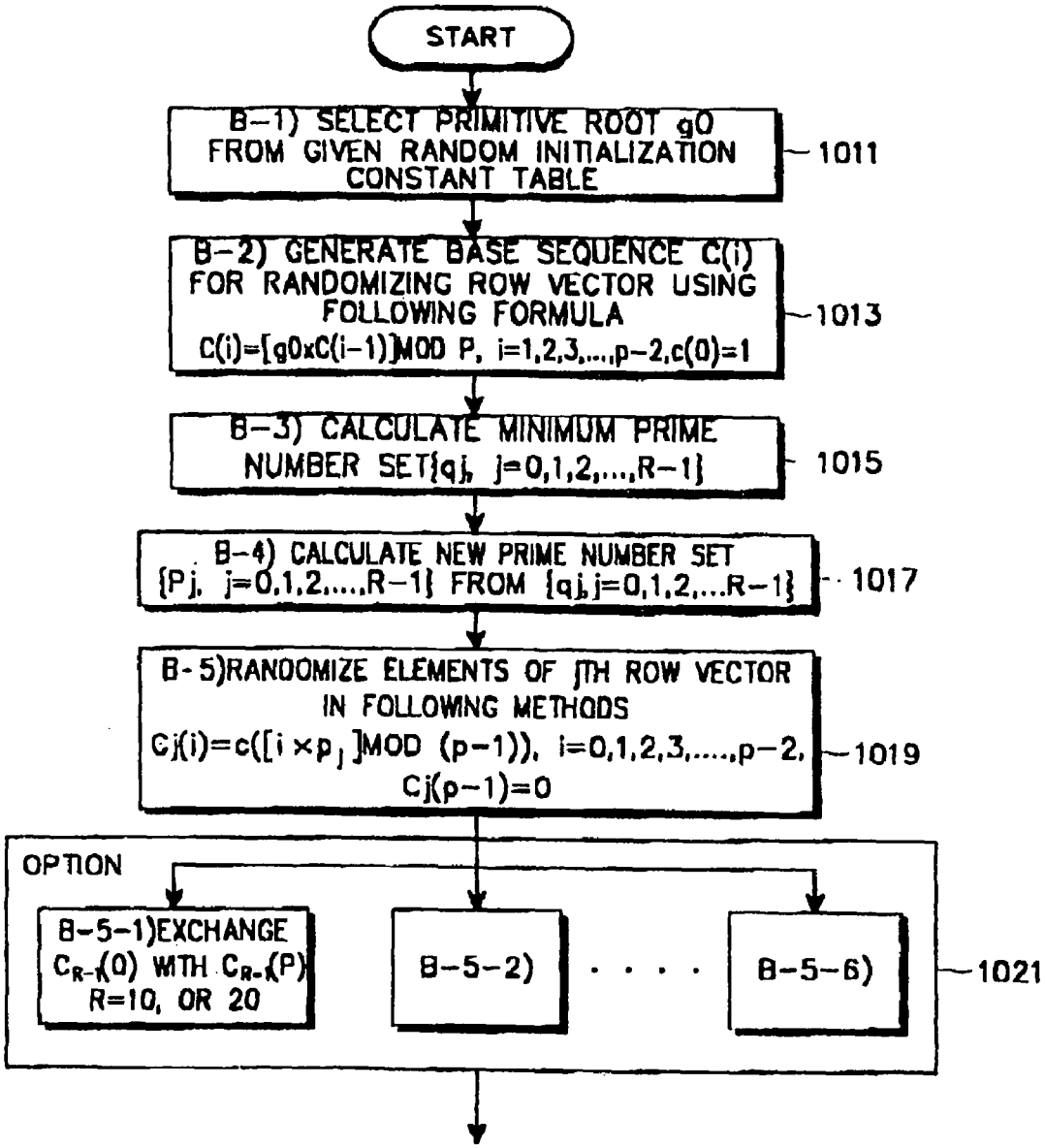
FIG. 12 is a flow chart for explaining an interleaving process of a modified PIL(Prime Interleaver) according to an embodiment of the present invention.

FIGS. 11 and 12 show a block diagram and a flow chart according to an embodiment of the present invention, respectively.

Referring to FIG. 11, a row vector permutation block (or row vector permutation index generator) 912 generates an index for selecting a row vector according to counting of a row counter 911, and provides the generated index to a high address buffer of the address buffer 918. The row vector permutation block 912 is a group selector for sequentially or randomly selecting, when the input information word is divided into a plurality of groups, the divided groups. A column vector permutation block (or column vector's elements permutation index generator) 914 generates, depending on a modified PIL algorithm 915, an index for permuting the positions of the elements in the corresponding row vector (or group) according to counting of a column counter 913, and provides the generated index to a low address buffer of the address buffer 918. The column vector permutation block 914 is a randomizer for permuting the position of the information bits in the group, which were sequentially stored in the order of input, according to a given rule. A RAM (Random Access Memory) 917 stores temporary data generated in the process of the program. A look-up table 916 stores parameters for interleaving and the primitive root. The addresses obtained by row permutation and column permutation (i.e., the addresses stored in the address buffer 918) are used as addresses for interleaving.

FIG. 12 shows a flow chart of the modified PIL algorithm. A description below relates to the second stage, Case-B, in the PIL algorithm. Referring to FIG. 12, a primitive root g0 is selected from a given random initialization constant table, in step 1011. Thereafter, in step 1013, a base sequence C(i) for randomizing the elements (or information bits) of the group is generated using the following formula.

$$C(i)=[g_0 \times C(i-1)] \bmod p,\ i=1,2,3, \ldots, p-2,\ C(0)=1$$

Thereafter, in step 1015, a minimum prime number set $\{q_j, j=0,1,2, \ldots, R-1\}$ given for the algorithm is calculated. Then, in step 1017, a prime number set $\{p_j=0,1,2, \ldots, R-1\}$ is calculated from the calculated minimum prime number set. Next, in step 1019, the elements of an jth group are randomized in the following method.

$$C_j(i)=c([i \times p_j] \bmod (p-1)),\ i=0,1,2,3, \ldots, p-2,$$

$$C_j(p-1)=0$$

Here, in order to increase the minimum free distance of the turbo encoder while randomizing the elements of the group, one of B-5-1) to B-5-6) is selected to permute (or shift) the information bits existing at the last position of the frame to other positions after interleaving.

B-5-1) means that the positions of the first information bit and the last information bit in the last group are exchanged with each other. B-5-2) means that the last two information bits in the last group are exchanged with each other. B-5-3) means that for every group, the information bit existing at the last position and the information bit existing at the foremost position are exchanged with each other. B-5-4) means that for every group, the positions of the last two information bits are exchanged. B-5-5) means that for every group, an optimal position k for a given interleaving rule is searched to exchange a position of the information bit existing at the last position of each row with a position of the information bit existing at the position k. Finally, B-5-6) means that for the last group, an optimal position k for a given interleaving rule is searched to exchange a position of the information bit existing at the last position with a position of the information bit existing at the position k.

By applying the modified algorithm to the PIL interleaver, it is possible to prevent a decrease in the free distance of the turbo encoder. Table 2 below shows a weight spectrum of the PIL interleaver before modification, and Table 3 below shows a weight spectrum of the PIL interleaver after modification.

In Tables 2 and 3, K indicates the size of the input information frame, Dfree(1) indicates a free distance calculated with the CISP for which the input information word has the Hamming weight 1, and Dfree(2) indicates a free distance calculated with the CISP for which the input information word has the Hamming weigh 2. For example, for K=600, Dfree(1) of the original PIL interleaver is indicated by 25/39/49/53/57/ . . . in Table 2, and this means that the minimum free distance is 25 and the next minimum free distance is 39. Similarly, Dfree(2)=38/38/42/ . . . means that the minimum free distance is 38. Therefore, it is noted that the minimum free distance is determined according to the free distance by the CISP with the Hamming weight 1. To prevent a decrease in the free distance by the CISP with the Hamming weight 1, the invention uses the B-5-1) method in this example. That is, Dfree(1) is improved by removing the CISP with the Hamming 1.

Table 2 below shows a weight spectrum of the PIL interleaver before modification.

TABLE 2

| K | Dfree(1) | Dfree(2) |
|---|---|---|
| 600 | Pos. = 599, Min. Weight = 25<br>25/39/49/53/57/61/65/67/67/77/ | Pos. = 29, min_pl = 36, Min. Weight = 38<br>38/38/42/42/42/42/42/42/42/ |
| 640 | Pos. = 630, Min. Weight = 25<br>25/37/53/53/53/69/71/73/75/77/ | Pos. = 440, min_pl = 447, Min. Weight = 40<br>40/40/42/42/44/44/46/46/46/48/ |
| 760 | Pos. = 759, Min. Weight = 25<br>25/41/57/57/59/69/75/77/81/83/ | Pos. = 33, min pl = 40, Min. Weight = 38<br>38/38/38/42/42/42/42/44/44/50/ |
| 840 | Pos. = 839, Min. Weight = 25<br>25/45/57/65/65/79/79/83/85/87/ | Pos. = 461, min pl = 468, Min. Weight = 36<br>36/38/40/42/42/42/44/46/46/46/ |
| 880 | Pos. = 879, Min. Weight = 25<br>25/47/57/61/65/71/83/89/93/93/ | Pos. = 294, min pl = 308, Min. Weight = 40<br>40/44/46/46/46/48/54/56/56/58/ |
| 960 | Pos. = 959, Min. Weight = 25<br>25/45/61/65/69/71/73/87/87/89/ | Pos. = 568, min pl = 575, Min. Weight = 36<br>36/38/38/42/42/42/42/44/44/46/ |

TABLE 2-continued

| K | Dfree(1) | Dfree(2) |
|---|---|---|
| 1080 | Pos. = 1079, Min. Weight = 25<br>25/49/61/65/67/77/85/89/93/97/ | Pos. = 1016, min pl = 1030, Min. Weight = 42<br>42/42/46/48/48/50/52/52/54/54/ |
| 1200 | Pos. = 1199, Min. Weight = 25<br>25/53/65/69/85/85/89/89/95/103/ | Pos. = 953, min pl = 967, Min. Weight = 38<br>38/38/42/42/42/42/46/48/50/50/ |
| 1240 | Pos. = 1239, Min. Weight = 25<br>25/53/67/69/71/85/93/93/103/105/ | Pos. = 1053, min pl = 1060, Min. Weight = 38<br>38/38/40/40/42/42/46/46/46/48/ |
| 1360 | Pos. = 1359, Min. Weight = 25<br>25/57/65/73/85/91/93/105/107/107/ | Pos. = 64, min pl = 71, Min. Weight = 38<br>38/42/42/42/42/44/46/46/46/50/ |
| 1440 | Pos. = 1439, Min. Weight = 25<br>25/53/63173/77/87/89/97/105/109/ | Pos. = 497, min pl = 504, Min. Weight = 36<br>36/42/42/46/46/50/50/52/54/58/ |
| 1480 | Pos. = 1479, Min. Weight = 25<br>25/61/65/77/77/83/95/101/109/117/ | Pos. = 1103, min pl = 1110, Min. Weight = 42<br>42/42/44/48/50/50/50/50/54/54/ |
| 1600 | Pos. = 1599, Min. Weight = 25<br>25/61/65/83/83/93/97/105/105/113/ | Pos. = 315, min pl = 322, Min. Weight = 38<br>38/38/38/40/42/44/50/50/50/54/ |
| 1680 | Pos. = 1679, Min. Weight = 25<br>25/69/69/81/89/95/103/113/117/125/ | Pos. = 504, min pl = 518, Min. Weight = 44<br>44/46/50/50/52/52/54/62/62/62/ |
| 1800 | Pos. = 1799, Min. Weight = 25<br>25/69/81/85/105/105/109/109/117/ | Pos. = 1439, min pl = 1446, Min. Weight = 34<br>34/42/42/42/46/48/50/58/60/62/ |
| 1960 | Pos. = 1959, Min. Weight = 25<br>25/77/79/83/89/91/97/109/113/125/ | Pos. = 1161, min pl = 1175, Min. Weight = 40<br>40/44/44/46/48/50/50/52/54/64/ |
| 2040 | Pos. = 2039, Min. Weight = 25<br>25/75/77/77/93/109/109/113/129/133/ | Pos. = 1932, min pl = 1939, Min. Weight = 38<br>38/40/54/54/56/64/64/74/74/74/ |
| 2080 | Pos. = 2079, Min. Weight = 25<br>25/69/77/81/93/103/109/111/119/121/ | Pos. = 928, min pl = 935, Min. Weight = 40<br>40/42/46/54/54/56/58/72/76/88/ |
| 2160 | Pos. = 2159, Min. Weight = 25<br>25/77/81/93/93/97/99/105/107/129/ | Pos. = 644, min pl = 651, Min. Weight = 38<br>38/42/46/50/52/54/54/54/54/60/ |
| 2200 | Pos. = 2199, Min. Weight = 25<br>25/57/63/81/97/101/117/121/133/141/ | Pos. = 1973, min pl = 1980, Min. Weight = 42<br>42/42/44/52/52/54/54/54/60/62/ |
| 2280 | Pos. = 2279, Min. Weight = 25<br>25/75/87/89/97/101/113/121/133/139/ | Pos. = 1136, min pl = 1150, Min. Weight = 42<br>42/42/42/44/50/54/54/54/62/62/ |
| 2560 | Pos. = 2559, Min. Weight = 25<br>25/71/73/95/97/109/119/149/149/153/ | Pos. = 1663, min pl = 1670, Min. Weight = 42<br>42/42/46/48/54/56/56/56/62/62/ |
| 2640 | Pos. = 2639, Min. Weight = 25<br>25/87/93/101/109/117/119/133/141/143/ | Pos. = 1582, min pl = 1589, Min. Weight = 38<br>38/42/42/42/44/46/50/56/62/66/ |
| 2760 | Pos. = 2759, Min. Weight = 25<br>25/97/101/103/113/113/121/141/143/ | Pos. = 820, min pl = 834, Min. Weight = 42<br>42/48/52/54/58/62/62/66/66/66/ |
| 2800 | Pos. = 2799, Min. Weight = 25<br>25/85/97/97/101/101/113/119/137/137/ | Pos. = 412, min pl = 419, Min. Weight = 44<br>44/58/62/62/70/72/72/76/80/82/ |
| 3000 | Pos. = 2999, Min. Weight = 25<br>25/85/89/105/123/127/155/157/165/171/ | Pos. = 2396, min pl = 2403, Min. Weight = 34<br>34/38/40/50/54/54/54/58/74/76/ |
| 3040 | Pos. = 3039, Min. Weight = 25<br>25/61/89/95/105/115/121/133/135/141/ | Pos. = 604, min pl = 611, Min. Weight = 38<br>38/38/42/46/46/52/52/64/66/76/ |
| 3160 | Pos. = 3159, Min. Weight = 25<br>25/101/101/105/109/125/127/141/145/149/ | Pos. = 2524, min pl = 2538, Min. Weight = 38<br>38/42/46/56/68/76/76/78/90/90/ |
| 3280 | Pos. = 3279, Min. Weight = 25<br>25/93/105/113/121/125/125/131/131/133/ | Pos. = 3109, min pl = 3123, Min. Weight = 42<br>42/50/52/62/62/76/90/90/90/90/ |
| 3360 | Pos. = 3359, Min. Weight = 25<br>25/71/73/107/117/129/141/141/153/169/ | Pos. = 3019, min pl = 3026, Min. Weight = 42<br>42/52/54/66/76/80/88/90/90/90/ |
| 3480 | Pos. = 3479, Min. Weight = 25<br>25/87/99/105/113/117/133/133/141/145/ | Pos. = 1042, min pl = 1049, Min. Weight = 38<br>38/38/54/54/56/58/58/58/60/62/ |
| 3600 | Pos. = 3599, Min. Weight = 25<br>25/97/109/121/137/139/153/167/167/177/ | Pos. = 1438, min pl = 1445, Min. Weight = 42<br>42/46/48/54/54/62/74/76/90,90/ |
| 3640 | Pos. = 3639, Min. Weight = 25<br>25/87/97/125/137/137/137/149/163/169/ | Pos. = 3262, min pl = 3276, Min. Weight = 54<br>54/58/58/62/66/68/72/74/82/88/ |
| 3840 | Pos. = 3839, Min. Weight = 25<br>25/53/97/115/117/129/145/147/151/153/ | Pos. = 759, min pl = 773, Min. Weight = 42<br>42/56/58/62/62/62/62/66/70/72/ |
| 3880 | Pos. = 3879, Min. Weight = 25<br>25/91/93/121/129/133/145/173/173/177/ | Pos. = 383 min pl = 397, Min. Weight = 54<br>54/56/60/62/66/74/86/90/90/90/ |
| 3960 | Pos. = 3959, Min. Weight = 25<br>25/91/105/125/125/133/135/137/141/143/ | Pos. = 1372 min pl = 1386, Min. Weight = 40<br>40/62/68/78/88/90/90/90/90/90/ |
| 4000 | Pos. = 3999, Min. Weight = 25<br>25/75/85/133/149/149/149/153/161/175/ | Pos. = 797 min pl = 804, Min. Weight = 38<br>38/42/42/50/54/54/54/54/54/56/ |
| 4240 | Pos. = 4239, Min. Weight = 25<br>25/109/119/143/151/153/157/165/169/193/ | Pos. = 3392, min pl = 3399, Min. Weight = 40<br>40/42/42/46/50/66/80/90/90/90/ |
| 4480 | Pos. = 4479, Min. Weight = 25<br>25/89/89/89/117/119/137/149/159/161/ | Pos. = 892, min pl = 899, Min. Weight = 38<br>38/38/42/42/42/46/54/64/90/90/ |
| 4560 | Pos. = 4559, Min. Weight = 25<br>25/113/121/125/137/149/161/165/175/177/ | Pos. = 1368, min pl = 1382, Min. Weight = 44<br>44/58/66/68/70/70/82/84/86/88/ |
| 4600 | Pos. = 4599, Min. Weight = 25<br>25/69/107/121/129/149/151/153/159/161/ | Pos. = 3676, min pl = 3683, Min. Weight = 34<br>34/48/50/58/62/66/66/76/86/90/ |
| 4680 | Pos. = 4679, Min. Weight = 25<br>25/99/109/137/143/153/171/177/179/187/ | Pos. = 928, min pl = 942, Min. Weight = 42<br>42/44/50/58/62/62/64/68/84/86/ |
| 4800 | Pos. = 4799, Min. Weight = 25<br>25/65/83/129/133/141/157/159/165/169/ | Pos. = 949, min pl = 963, Min. Weight = 42<br>42/42/50/56/58/66/66/66/70/70/ |
| 4840 | Pos. = 4839, Min. Weight = 25<br>25/95/129/141/145/151/157/161/173/177/ | Pos. = 3858, min pl = 3872, Min. Weight = 42<br>42/72/80/82/84/90/90/90/90/90/ |
| 5040 | Pos. = 5039, Min. Weight = 25<br>25/157/165/165/175/177/189/189/193/197/ | Pos. = 4534, min pl = 4548, Min. Weight = 46<br>46/54/54/58/60/60/62/76/82/90/ |

TABLE 2-continued

| K | Dfree(1) | Dfree(2) |
|---|---|---|
| 5160 | Pos. = 5159, Min. Weight = 25<br>25/81/95/137/137/145/147/165/181/185/ | Pos. = 2314, min pl = 2321, Min. Weight = 40<br>40/40/46/50/58/58/58/62/66/84/ |
| 5280 | Pos. = 5279, Min. Weight = 25<br>25/75/101/109/133/137/165/169/181/185/ | Pos. = 1579, min pl = 1593, Min. Weight = 42<br>42/50/62/66/70/72/82/82/90/90/ |
| 5400 | Pos. = 5399, Min. Weight = 25<br>25/99/117/117/125/133/169/173/189/197/ | Pos. = 5124, min pl = 5131, Min. Weight = 38<br>38/50/52/54/58/72/90/90/90/90/ |
| 5440 | Pos. = 5439, Min. Weight = 25<br>25/73/109/143/169/169/169/173/175/181/ | Pos. = 4617, min pl = 4624, Min. Weight = 50<br>50/58/60/62/76/90/90/90/90/90/ |
| 5560 | Pos. = 5559, Min. Weight = 25<br>25/105/141/143/177/181/189/193/193/201/ | Pos. = 4441, min pl = 4448, Min. Weight = 38<br>38/42/46/54/66/78/84/88/88/90/ |
| 5640 | Pos. = 5639, Min. Weight = 25<br>25/101/115/145/153/153/153/165/169/173/ | Pos. = 1120, min pl = 1134, Min. Weight = 42<br>42/62/76/86/86/90/90/90/90/90/ |
| 5680 | Pos. = 5679, Min. Weight = 25<br>25/101/145/165/173/181/187/187/193/197/ | Pos. = 851, min pl = 858, Min. Weight = 50<br>50/54/62/74/78/80/82/84/88/88/ |
| 5880 | Pos. = 5879, Min. Weight = 25<br>25/103/129/161/173/177/189/199/201/201/ | Pos. = 4410, min pl = 4417, Min. Weight = 42<br>42/52/72/80/90/90/90/90/90/90/ |
| 6160 | Pos. = 6159, Min. Weight = 25<br>25/129/155/157/165/187/197/205/209/217/ | Pos. = 5849, min pl = 5863, Min. Weight = 42<br>42/44/46/58/90/90/90/90/90/90/ |
| 6240 | Pos. = 6239, Min. Weight = 25<br>25/119/119/123/169/185/197/199/213/213/ | Pos. = 305, min pl = 319, Min. Weight = 42<br>42/42/62/80/90/90/90/90/90/90/ |
| 6280 | Pos. = 6279, Min. Weight = 25<br>25/117/133/137/161/175/177/195/197/197/ | Pos. = 5323, min pl = 5337, Min. Weight = 44<br>44/68/72/72/80/88/90/90,90/90/ |
| 6360 | Pos. = 6359, Min. Weight = 25<br>25/109/137/141/141/145/147/161/187/201/ | Pos. = 5081, min pl = 5095, Min. Weight = 38<br>38/42/46/62/78/86/90/90/90/90/ |
| 6640 | Pos. = 6639, Min. Weight = 25<br>25/101/109/139/147/175/177/185/209/217/ | Pos. = 3645, min pl = 3652, Min. Weight = 44<br>44/54/58/60/64/90/90/90/90/90/ |
| 6760 | Pos. = 6759, Min. Weight = 25<br>25/105/125/165/203/215/217/229/249/249/ | Pos. = 6409, min pl = 6423, Min. Weight = 42<br>42/50/70/84/90/90/90/90,90/90/ |
| 6960 | Pos. = 6959, Min. Weight = 25<br>25/123/145/145/161/209/211/217/219/223/ | Pos. = 5565, min pl = 5572, Min. Weight = 34<br>34/50/54/62/66/80/82/88/90/90/ |
| 7000 | Pos. = 6999, Min. Weight = 25<br>25/111/145/145/197/221/221/233/235/237/ | Pos. = 3846, min pl = 3853, Min. Weight = 38<br>38/52/54/60/62/72/84/90/90/90/ |
| 7080 | Pos. = 7079, Min. Weight = 25<br>25/117/129/161/165/169/171/175/175/177/ | Pos. = 2122, min pl = 2129, Min. Weight = 38<br>38/42/50/54/54/58/72/84/88/90/ |
| 7200 | Pos. = 7199, Min. Weight = 25<br>25/167/169/173/185/185/215/217/225/225/ | Pos. = 6833, min pl = 6840, Min. Weight = 44<br>44/50/66/84/90/90/90/90/90/90/ |
| 7360 | Pos. = 7359, Min. Weight = 25<br>25/81/157/169/173/173/183/221/221/221/ | Pos. = 1836, min pl = 1843, Min. Weight = 46<br>46/60/72/82/82/90/90/90/90/90/ |
| 7480 | Pos. = 7479, Min. Weight = 25<br>25/117/153/201/207/217/217/227/229/233/ | Pos. = 1865, min pl = 1872, Min. Weight = 46<br>46/66/66/72/82/82/90/90/90/90/ |
| 7600 | Pos. = 7599, Min. Weight = 25<br>25/125/155/157/201/221/223/239/245/251/ | Pos. = 1893, min pl = 1900, Min. Weight = 46<br>46/56/58/72/84/90/90/90/90/90/ |
| 7680 | Pos. = 7679, Min. Weight = 25<br>25/133/153/157/189/207/237/241/243/253/ | Pos. = 2865, min pl = 2872, Min. Weight = 78<br>78/90/90/90/90/90/90/90/90/90/ |
| 7800 | Pos. = 7799, Min. Weight = 25<br>25/115/151/157/181/193/209/241/249/251/ | Pos. = 1170, min pl = 1184, Min. Weight = 44<br>44/50/64/72/76/80/86/90/90/90/ |
| 7960 | Pos. = 7959, Min. Weight = 25<br>25/135/145/153/169/169/185/217/223/223/ | Pos. = 398, min pl = 405, Min. Weight = 40<br>40/80/86/88/90/90/90/90/90/90/ |
| 8040 | Pos. = 8039, Min. Weight = 25<br>25/109/109/111/141/185/201/219/241/249/ | Pos. = 7054, min pl = 7068, Min. Weight = 56<br>56/68/90/90/90/90/90/90/90/90/ |

Table 3 below shows a weight spectrum of the PIL interleaver after modification, where one modification step is selected and used for all frames.

TABLE 3

| K | Dfree(1)/PILSS | Dfree(2)/PILSS |
|---|---|---|
| 600 | pos. = 569, Min. Weight = 39<br>39/41/49/53/57/61/65/67/67/77/ | pos. = 29, min pl = 36, Min. Weight = 38<br>38/38/42/42/42/42/42/42/42/42/ |
| 640 | Pos. = 607, Min. Weight = 37<br>37/43/53/53/53/69/71/73/75/77/ | pos. = 440, min pl = 447, Min. Weight = 40<br>40/40/42/42/44/44/46/46/46/48/ |
| 760 | Pos. = 721, Min. Weight = 41<br>41/45/57/57/59/69/75/77/81/83/ | pos. = 33, min pl = 40, Min. Weight = 38<br>38/38/38/42/42/42/42/44/44/50/ |
| 840 | pos. = 797, Min. Weight = 45<br>45/45/57/65/65/79/79/83/85/87/ | pos. = 461, min pl = 468, Min. Weight = 36<br>36/38/40/42/42/42/44/46/46/46/ |
| 880 | pos. = 835, Min. Weight = 47<br>47/49/57/61/65/71/83/89/93/93/ | pos. = 294, min pl = 308, Min. Weight = 40<br>40/44/46/46/46/48/54/56/56/58/62/ |
| 960 | pos. = 911, Min. Weight = 45<br>45/49/61/65/69/71/73/87/87/89/ | pos. = 568, min pl = 575, Min. Weight = 36<br>36/38/38/42/42/42/42/44/44/46/ |
| 1080 | pos. = 1025, Min. Weight = 49<br>49/53/61/65/67/77/85/89/93/97/ | pos. = 1016, min pl = 1030, Min. Weight = 42<br>42/42/46/48/48/50/52/52/54/54/ |
| 1200 | pos. = 1139, Min. Weight = 25<br>53/59/65/69/85/85/89/89/95/103/ | pos. = 953, min pl = 967, Min. Weight = 38<br>38/38/42/42/42/42/46/48/50/50/ |

TABLE 3-continued

| K | Dfree(1)/PILSS | Dfree(2)/PILSS |
|---|---|---|
| 1240 | pos. = 1177, Min. Weight = 53<br>53/57/67/69/71/85/93/93/103/105/ | pos. = 1053, min pl = 1060, Min. Weight = 38<br>38/38/40/40/42/42/46/46/46/48/ |
| 1360 | pos. = 1291, Min. Weight = 53<br>57/61/65/73/85/91/93/105/107/107/ | pos. = 64, min pl = 71, Min. Weight = 38<br>38/42/42/42/42144/46/46/46/50/ |
| 1440 | pos. = 1429, Min. Weight = 53<br>53/63/65/73/77/87/89/97/105/109/ | pos. = 497, min pl = 504, Min. Weight = 36<br>36/42/42/46/46/50/50/52/54/58/ |
| 1480 | pos. = 1405, Min. Weight = 61<br>61/65/67/77/77/83/95/101/109/117/ | pos. = 1103, min pl = 1110, Min. Weight = 42<br>42/42/44/48/50/50/50/50/54/54/ |
| 1600 | pos. = 1573, Min. Weight = 61<br>61/65/69/83/83/93/97/105/105/113/ | pos. = 315, min pl = 322, Min. Weight = 38<br>38/38/38/40/42/44/50/50/50/54/ |
| 1680 | pos. = 1595, Min. Weight = 69<br>69/69/69/81/89/95/103/113/117/125/ | pos. = 504, min pl = 518, Min. Weight = 44<br>44/46/50/50/52/52/54/62/62/62/ |
| 1800 | pos. = 1709, Min. Weight = 69<br>69/73/81/85/105/105/109/109/117/ | pos. = 1439, min pl = 1446, Min. Weight = 34<br>34/42/42/42/46/48/50/58/60/62/ |
| 1960 | pos. = 1861, Min. Weight = 77<br>77/77/79/83/89/91/97/109/113/125/ | pos. = 1161, min pl = 1175, Min. Weight = 40<br>40/44/44/46/48/50/50/52/54/64/ |
| 2040 | pos. = 2014, Min. Weight = 75<br>75/77/77/83/93/109/109/113/129/133/ | pos. = 1114, min pl = 1121, Min. Weight = 40<br>40/54/54/56/64/64/74/74/74/80/ |
| 2080 | pos. = 2038, Min. Weight = 69<br>69/77/81/81/93/103/109/111/119/121/ | pos. = 928, min pl = 935, Min. Weight = 40<br>40/42/46/54/54/56/58/72/76/88/ |
| 2160 | pos. = 2106, Min. Weight = 77<br>77/81/85/93/93/97/99/105/107/129/ | pos. = 644, min pl = 651, Min. Weight = 38<br>38/42/46/50/52/54/54/54/54/60/ |
| 2200 | pos. = 2181, Min. Weight = 57<br>57/63/81/95/97/101/117/121/133/141/ | pos. = 1973, min pl = 1980, Min. Weight = 42<br>42/42/44/52/52/54/54/54/60/62/ |
| 2280 | pos. = 2254, Min. Weight = 75<br>75/87/89/89/97/101/113/121/133/139/ | pos. = 1136, min pl = 1150, Min. Weight = 42<br>42/42/42/44/50/54/54/54/62/62/ |
| 2560 | pos. = 2545, Min. Weight = 71<br>71/73/95/97/97/109/119/149/149/153/ | pos. = 1663, min pl = 1670, Min. Weight = 42<br>42/46/48/54/56/56/56/62/64/72/ |
| 2640 | pos. = 2574, Min. Weight = 87<br>87/93/97/101/109/117/119/133/141/143/ | pos. = 1582, min pl = 1589, Min. Weight = 38<br>38/42/42/42/44/46/50/56/62/66/ |
| 2760 | pos. = 2621, Min. Weight = 97<br>97/101/101/103/113/113/121/141/143/ | pos. = 820, min pl = 834, Min. Weight = 42<br>42/48/52/54/58/62/62/66/66/66/ |
| 2800 | pos. = 2730, Min. Weight = 85<br>85/97/97/101/101/101/113/119/137/137/ | pos. = 412, min pl = 419, Min. Weight = 44<br>44/58/62/62/66/70/72/72/76/80/ |
| 3000 | pos. = 2962, Min. Weight = 85<br>85/89/105/109/123/127/155/157/165/171/ | pos. = 2396, min pl = 2403, Min. Weight = 34<br>34/38/40/50/54/54/54/58/74/76/ |
| 3040 | pos. = 3014, Min. Weight = 61<br>61/89/95/105/109/115/121/133/135/141/ | pos. = 604, min pl = 611, Min. Weight = 38<br>38/38/42/46/46/52/52/64/66/76/ |
| 3160 | pos. = 3065, Min. Weight = 101<br>101/101/105/109/115/125/127/141/145/149/ | pos. = 2524, min pl = 2538, Min. Weight = 38<br>38/42/46/56/68/76/76/78/90/90/ |
| 3280 | pos. = 3198, Min. Weight = 93<br>93/105/113/117/121/125/125/131/131/133/ | pos. = 3109, min pl = 3123, Min. Weight = 42<br>42/50/52/62/62/76/90/90/90/90/ |
| 3360 | pos. = 3339, Min. Weight = 71<br>71/73/107/117/117/129/141/141/153/169/ | pos. = 3019, min pl = 3026, Min. Weight = 42<br>42/52/54/66/76/80/88/90/90/90/ |
| 3480 | pos. = 3436, Min. Weight = 87<br>87/99/105/113/117/121/133/133/141/145/ | pos. = 1042, min pl = 1049, Min. Weight = 38<br>38/38/54/54/56/58/58/58/60/62/ |
| 3600 | pos. = 3510, Min. Weight = 97<br>97/109/121/125/137/139/153/167/167/177/ | pos. = 1438, min pl = 1445, Min. Weight = 42<br>42/46/48/54/54/62/74/76/90/90/ |
| 3640 | pos. = 3594, Min. Weight = 87<br>87/97/125/125/137/137/137/149/163/169/ | pos. = 3262, min pl = 3276, Min. Weight = 54<br>54/58/58/62/66/68/72/74/82/88/ |
| 3840 | pos. = 3829, Min. Weight = 53<br>53/97/115/117/129/133/145/147/151/153/ | pos. = 759, min pl = 773, Min. Weight = 42<br>42/56/58/62/62/62/62/66/70/72/ |
| 3880 | pos. = 3825, Min. Weight = 91<br>91/93/121/129/133/133/145/173/173/177/ | pos. = 383 min pl = 397, Min. Weight = 54<br>54/56/60/62/66174/86/90/90/90/ |
| 3960 | pos. = 3910, Min. Weight = 91<br>91/105/125/125/133/135/137/137/141/143/ | pos. = 1372 min pl = 1386, Min. Weight = 40<br>40/62/68/78/88/90/90/90/90/90/ |
| 4000 | pos. = 3977, Min. Weight = 75<br>75/85/133/139/149/149/149/153/161/175/ | pos. = 797 min pl = 804, .Min. Weight = 38<br>38/42/42/50/5454/54/54/54/56/ |
| 4240 | pos. = 4134, Min. Weight = 109<br>109/119/143/145/151/153/157/165/169/193/ | pos. = 3392, min pl = 3399, Min. Weight = 40<br>40/42/42/46/50/66/80/90/90/90/ |
| 4480 | pos. = 4405, Min. Weight = 89<br>89/89/89/117/119/137/149/149/159/161/ | pos. = 892, min pl = 899, Min. Weight = 38<br>38/38/42/42/42/46/54/64/90/90/ |
| 4560 | pos. = 4446, Min. Weight = 113<br>113/121/125/137/149/155/161/165/175/177/ | pos. = 1368, min pl = 1382, Min. Weight = 44<br>44/58/66/68/70/70/82/84/86/88/ |
| 4600 | pos. = 4561, Min. Weight = 69<br>69/107/121/129/149/151/153/153/159/161/ | pos. = 3676, min pl = 3683, Min. Weight = 34<br>34/48/50/58/62/66/66/76/86/90/ |
| 4680 | pos. = 4656, Min. Weight = 99<br>99/109/137/143/153/171/171/177/179/187/ | pos. = 928, min pl = 942, Min. Weight = 42<br>42/44/50/58/62/62/64/68/84/86/ |
| 4800 | pos. = 4765, Min. Weight = 65<br>65/83/129/133/141/157/159/161/165/169/ | pos. = 949, min pl = 963, Min. Weight = 42<br>42/42/50/56/58/66/66/66/70/70/ |
| 4840 | pos. = 4780, Min. Weight = 95<br>95/129/141/145/151/157/161/163/173/177/ | pos. = 3858, min pl = 3872, Min. Weight = 42<br>42/72/80/82/84/90/90/90/90/90/ |
| 5040 | pos. = 5029, Min. Weight = 157<br>157/165/165/165/175/177/189/189/193/197/ | pos. = 4534, min pl = 4548, Min. Weight = 46<br>46/54/54/58/60/60/62/76/82/90/ |
| 5160 | pos. = 5140, Min. Weight = 81<br>81/95/137/137/145/147/165/169/181/185/ | pos. = 2314, min pl = 2321, Min. Weight = 40<br>40/40/46/50/58/58/58/62/66/84/ |
| 5280 | pos. = 5285, Min. Weight = 75<br>75/101/109/133/137/165/169/173/181/185/ | pos. = 1579, min pl = 1593, Min. Weight = 42<br>42/50/62/66/70/72/82/82/90/90/ |

TABLE 3-continued

| K | Dfree(1)/PILSS | Dfree(2)/PILSS |
|---|---|---|
| 5400 | pos. = 5332, Min. Weight = 99<br>99/117/117/125/133/169/173/179/189/197/ | pos. = 1883, min pl = 1890, Min. Weight = 50<br>50/52/54/58/72/90/90/90/90/90/ |
| 5440 | pos. = 5394, Min. Weight = 73<br>73/109/143/169/169/169/173/175/177/181/ | pos. = 4617, min pl = 4624, Min. Weight = 50<br>50/58/60/62/76/90/90/90/90/90/ |
| 5560 | pos. = 5520, Min. Weight = 105<br>105/141/143/177/181/181/189/193/193/201/ | pos. = 4441, min pl = 4448, Min. Weight = 38<br>38/42/46/54/6628/84/88/88/90/ |
| 5640 | pos. = 5587, Min. Weight = 101<br>101/115/145/153/153/153/165/169/173/173/ | pos. = 1120, min pl = 1134, Min. Weight = 42<br>42/62/76/86/86/90/90/90/90/90/ |
| 5680 | pos. = 5585, Min. Weight = 101<br>101/145/165/173/181/187/187/187/193/197/ | pos. = 851, min pl = 858, Min. Weight = 50<br>50/54/62/14/78/80/82/84/88/88/ |
| 5880 | pos. = 5806, Min. Weight = 103<br>103/129/161/173/177/189/189/199/201/201/ | pos. = 4410, min pl = 4417, Min. Weight = 42<br>42/52/72/80/90/90/90/90/90/90/ |
| 6160 | pos. = 6111, Min. Weight = 129<br>129/155/157/165/187/197/197/205/209/217/ | pos. = 5849, min pl = 5863, Min. Weight = 42<br>42/44/46/58/90/90/90/90/90/90/ |
| 6240 | pos. = 6140, Min. Weight = 119<br>119/119/123/169/185/197/199/203/213/213/ | pos. = 305, min pl = 319, Min. Weight = 42<br>42/42/62/80/90/90/90/90/90/90/ |
| 6280 | pos. = 6234, Min. Weight = 117<br>117/133/137/161/175/177/195/197/197/199/ | pos. = 5323, min pl = 5337, Min. Weight = 44<br>44/68/72/72/80/88/90/90/90/90/ |
| 6360 | pos. = 6280, Min. Weight = 109<br>109/137/141/141/145/147/161/187/201/205/ | pos. = 5081, min pl = 5095, Min. Weight = 38<br>38/42/46/62/78/86/90/90/90/90/ |
| 6640 | pos. = 6590, Min. Weight = 101<br>101/109/139/147/175/177/185/209/213/217/ | pos. = 3645, min pl = 3652, Min. Weight = 44<br>44/54/58/60/64/90/90/90/90/90/ |
| 6760 | pos. = 6658, Min. Weight = 105<br>105/125/165/203/215/217/217/229/249/249/ | pos. = 670, min pl = 677, Min. Weight = 50<br>50/70/84/90/90/90/90/90/90/90/ |
| 6960 | pos. = 6894, Min. Weight = 123<br>123/145/145/161/209/211/217/219/221/223/ | pos. = 5565, min pl = 5572, Min. Weight = 34<br>34/50/54/62/66/80/82/88/90/90/ |
| 7000 | pos. = 6912, Min. Weight = 111<br>111/145/145/197/221/221/221/233/235/237/ | pos. = 3846, min pl = 3853, Min. Weight = 38<br>38/52/54/60/62/72/84/90/90/90/ |
| 7080 | pos. = 7018, Min. Weight = 117<br>117/129/161/165/169/171/175/175/177/181/ | pos. = 2122, min pl = 2129, Min. Weight = 38<br>38/42/50/54/54/58/72/84/88/90/ |
| 7200 | pos. = 6994, Min. Weight = 167<br>167/169/173/185/185/215/217/225/225/229/ | pos. = 6833, min pl = 6840, Min. Weight = 44<br>44/50/66184/90/90/90/90/90/90/ |
| 7360 | pos. = 7298, Min. Weight = 81<br>81/157/169/173/173/183/221/221/221/229/ | pos. = 1836, min pl = 1843, Min. Weight = 46<br>46/60/72/82/82/90/90/90/90/90/ |
| 7480 | pos. = 7386, Min. Weight = 117<br>117/153/201/207/217/217/227/229/233/233/ | pos. = 1865, min pl = 1872, Min. Weight = 46<br>46/66/66/72/82/82/90/90/90/90/ |
| 7600 | pos. = 7528, Min. Weight = 125<br>125/155/157/201/221/223/239/241/245/251/ | pos. = 1893, min pl = 1900, Min. Weight = 46<br>46/56/58/72/84/90/90/90/90/90/ |
| 7680 | pos. = 7526, Min. Weight = 133<br>133/153/157/189/207/237/241/241/243/253/ | pos. = 2865, min pl = 2872, Min. Weight = 78<br>78/90/90/90/90/90/90/90/90/90/ |
| 7800 | pos. = 7702, Min. Weight = 115<br>115/151/157/181/193/209/241/245/249/251/ | pos. = 1170, min pl = 1184, Min. Weight = 44<br>44/50/64/72176/80/86/90/90/90/ |
| 7960 | pos. = 7832, Min. Weight = 135<br>135/145/153/169/169/185/217/223/223/237 | Pos. = 398, min pl = 405, Min. Weight = 40<br>40/80/86188/90/90/90190/90/90/ |
| 8040 | pos. = 8006, Min. Weight = 109<br>109/109/111/141/185/201/219/241/249/253 | pos. = 7054, min pl = 7068, Min. Weight = 56<br>56/68/90/90/90/90/90/90/90/90/ |

As described above, the novel turbo encoder suppresses a decreases in the free distance dfree caused by one or more information bits of '1' located at the last period of a data frame input to the component encoder, using the internal interleaver, thereby contributing to implementation of a turbo encoder with high performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A turbo encoder comprising:

a first encoder *configured* for encoding a frame of *K* input information bits to generate first coded symbols;

an interleaver *configured* for

[receiving] *sequentially writing* the *K* information bits *into a Row* (*R*)×*Column* (*C*) *rectangular matrix, row by row, starting in a first column of a first row,*

*intra row permuting positions of the K information bits in the R×C rectangular matrix in each row according to a given interleaving rule,*

*exchanging a position of an information bit in a last column of a last row with a position of an information bit in the first column of the last row, after the intra row permuting,*

*performing inter-row permutations of the R×C rectangular matrix, and*

[and interleaving the information bits position such that an information bit existing at the last position of the frame is shifted to a position preceding the last position for not generating Critical Information Sequence Pattern (CISP)] *reading out the information bits from the permuted R×C rectangular matrix, column by column, starting in the first row of the first column*; and a second encoder *configured* for encoding the [interleaved] *read out* information bits to generate second coded symbols,

*wherein the R×C rectangular matrix includes R rows and C columns, K=R×C, and K indicates a number of the information bits included in the frame*.

2. The turbo encoder as claimed in claim 1, wherein the interleaver comprises:

a controller for writing the information bits sequentially in memory and dividing the information bits into R groups each having [the] C information bits; permuting [the] *an* address of [the] *an* information bit written in a jth row (where, j=0,1,2, . . . , R−1) to positions $C_j(i)$ in the row in accordance with an algorithm given by i) $C(i)=[g0\times C(i-1)] \bmod p$, i=1,2, . . . , (p−2) and C(0)=1 ii) $C_j(i)=C([i\times p_j] \bmod (p-1))$, j=0,1,2, . . . , (R−1), i=0,1,2, . . . , (p−[1] 2), $C_j(p-1)=0$, and $C_j(p)=p$ iii) exchange $C_{R-1}(p)$ with $C_{R-1}(0)$ where p [(prime number)] indicates a *minimum* prime number [which is closest to K/R] *satisfying* $0\leqq(p+1)-K/R$, g0 [(primitive root)] indicates [a predetermined number corresponding to] *an associated primitive root for* p, and $p_j$ indicates a primitive number set.

[3. The turbo encoder as claimed in claim 2, wherein the interleaver comprises:

a memory for storing the information bit frame sequentially;

a randomizer for permuting the address of the stored informnation bits according as shifting the address of an informnation bit existing at the last position to a position preceding the last position in the last group.]

[4. The turbo encoder as claimed in claim 3, wherein the randomizer exchanges an information bit address existing at the last position of the last group with an information bit address existing at a first position of the last group.]

5. A device for permuting information bit addresses of an input frame which have [R] *Row* (*R*) groups, each *of the R groups* having [C] *Column* (*C*) information bits, in a prime interleaver (PIL) used as an internal interleaver for a turbo encoder, the device comprising:

a memory for storing the information bit frame sequentially; *and* a randomizer for permuting the addresses of the information bit *frame according to a given interleaving rule,* and [changing the] *exchanging an* address of [an] *a* last information bit [to a position preceding the position in the] *position with an address of an information bit existing at a first position of a* last group, *after the permuting*.

[6. The device as claimed in claim 5, wherein the randomizer exchanges an information bit position existing at the last position of the last group with an information bit position existing at a first position of the last group.]

7. A device for interleaving a frame of K information bits which have [R] *Row* (*R*) groups, each *of the R groups* having [C] *Column* (*C*) information bits, in a [PIL interleaver] *prime interleaver* (*PIL*) used as an internal interleaver for a turbo encoder, the device comprising:

a controller for writing input information bits of a frame in a memory sequentially and permuting [the position] *positions* of [the] information bits written in a jth row (where, j can be 0,1,2, . . . , or R−1) to position $C_j(i)$ in the row in accordance with an algorithm given by i) permute a base sequence $C(i)=[g0\times C(i-1)] \bmod p$, i=1,2, . . . , (p−2) and C(0)=1 ii) perform row permutation $C_j(i)=C([i\times p_j] \bmod (p-1))$, j=0,1,2, . . . , (R−1), i=0,1,2, . . . , (p−[1] 2), $C_j(p-1)=0$, and $C_j(p)=p$ iii) exchange $C_{R-1}(p)$ with $C_{R-1}(0)$ where p [(prime number)] indicates a *minimum* prime number [which is closest to K/R] *satisfying* $0\leqq(p+1)-K/R$, g0 [(primitive root)] indicates [a predetermined number corresponding to] *an associated primitive root for* p, and $p_j$ indicates a primitive number set.

8. A 2-dimensional interleaving method comprising the steps of:

storing a frame of K input information bits into a memory sequentially and dividing [an] *the* information bits into [R] *Row* (*R*) groups, each *of the R groups* having [C] *Column* (*C*) information bits;

permuting [the] information bits addresses of [the] each group according to a given rule; and

[changing] *exchanging* an information bit address existing at [the] *a* last position of [the] *a* last group [to a address preceding the last position] *with an information bit address existing at a first position of the last group, subsequent to the permuting*.

9. [A] *The* 2-dimensional interleaving method as claimed in claim 8, wherein [the] permuting *the information bits addresses*, *comprises*:

determining a minimum prime number p [which is closest to K/R] *satisfying* $0\leqq(p+1)-K/R$, sequentially writing input sequences of information bits of a frame in a memory;

selecting a primitive root g0 corresponding to the minimum prime number p, and generating a base sequence C(i) for intra-row permuting the input sequences written in the rows in accordance with $$C(i)=[g0\times C(i-1)] \bmod p,\ i=1,2,\ldots,(p-2),\ \text{and}\ C(0)=1;$$

calculating a minimum prime integer set $\{q_j\}$(j=0,1, 2, . . . , R−1) by determining $$\text{g.c.d}\{q_j,p-1\}=1$$

$$q_j>6,\ q_j>q_{(j-1)}$$

where g.c.d is a greatest common divider and $q_0=1$;

intra-row permuting $\{q_j\}$ using $$p_{P(j)}=q_j,\ j=0,1,\ldots,R-1$$

where P(j) indicates a predetermined selecting order for selecting the R rows;

when C=p+1, permuting sequences in a jth row in accordance with $$C_j(i)=C([i\times p_j] \bmod (p-1)),$$

where j=0,1,2, . . . , (R−1), i=0,1,2, . . . , (p−[1] 2), $C_j(p-1)=0$, and $C_j(p)=p$, and if (K=C×R), then $C_{R-1}(p)$ is exchanged with $C_{R-1}(0)$.

[10. The 2-dimensional interleaving method as claimed in claim 8, wherein an information bit address existing at the last position of the last group is exchanged with an information bit address existing at a first position of the last group.]

11. A 2-dimensional interleaving method comprising the steps of:

writing input sequences of a frame of input information bits which have [R] *Row* (*R*) groups, each *of the R groups* having [C] *Column* (*C*) information bits, in a memory;

permuting [the address] *addresses* of the information bits written in *the* memory according to a given rule; *and*

[shifting] *exchanging* an address of an information bit written in [the] *a* last position of [the] *a* last group [to a position preceding] *with an address of an information written in a first position of* the last group, *subsequent to the permuting*.

[12. The 2-dimensional interleaving method as claimed in claim 11, wherein the input sequence written in the last position of the last group is exchanged with an input sequence written in a first position of the last group.]

13. A method for interleaving a frame of input information bits which have [R] *Row* (*R*) groups, each *of the R groups* having [C] *Column* (*C*) information bits, in a [PIL interleaver] *prime interleaver* (*PIL*) used as an internal interleaver for a turbo encoder, the method comprising the steps of:

a) permuting [the] information bits [position] *positions* of the groups according to *a* predetermined PIL interleaving rule; *and* b) [changing] *exchanging* an information bit existing at [the] *a* last position of [the frame to a position preceding the last position] *a last group with an information bit existing at a first position of the last group, subsequent to the permuting*.

[14. The method as claimed in claim 13, wherein an information bit position existing at the last position of the last group is exchanged with an information bit existing at a first position of the last group.]

15. The method as claimed in claim 13, wherein in the step a and b), the information bits [position] *positions* of the frame written in [an] *a* jth row (where j=0,1,2, . . . , R−1) are permuted to positions $C_j(i)$ in the row in accordance with [the steps of] an algorithm given by [the steps of]

i) calculating $C(i)=[g0\times c(i-1)] \bmod p$, i=1,2, . . . , (p−2) and C(0)=1 ii) calculating $C_j(i)=C([i\times p_j] \bmod (p-1))$, where j=0,1,2, . . . , (R−1), i=0,1,2, . . . , (p−[1] *2*), $C_j(p-1)=0$, and $C_j(p)=p$ iii) exchanging $C_{R-1}(p)$ with $C_{R-1}(0)$ where p [(prime number)] indicates a *minimum* prime number [which is closest to K/R] *satisfying* $0\leqq(p+1)-K/R$, *K indicates a number of the input information bits in the frame,* g0 [(primitive root)] indicates [a predetermined number corresponding to] *an associated primitive root for* p, $p_j$ indicates a primitive number set, and $c_j(i)$ is [the] *an* input bit position of an ith output after the permutation of a jth row.

16. A 2-dimensional interleaving method comprising the steps of:

sequentially writing input sequences of information bits of [the] *a* frame in [an R] *a Row* [(R)]×[C] *Column* rectangular matrix;

selecting a primitive root g0 corresponding to [the] *a* minimum prime number p, and generating a base sequence c(i) for intra-row permuting the input sequences written in [the] rows *of the R×C rectangular matrix* in accordance with $$C(i)=[g0\times C(i-1)] \bmod p,\ i=1,2,\ldots,(p-2),\ \text{and}\ C(0)=1;$$

calculating a minimum prime integer set $\{q_j\}$(j=0,1, 2, . . . , R−1) by determining $$\text{g.c.d}\{q_j,p-1\}=1$$

$$q_j>6,\ q_j>q_{(j-1)}$$

where g.c.d is a greatest common divider and $q_0=1$;

intra-row permuting $\{q_j\}$ using $$p_{P(j)}=q_j,\ j=0,1,\ldots,R-1$$

where P(j) indicates a predetermined selecting order for selecting the R rows;

when C=p+1, permuting sequences in a jth row in accordance with $$C_j(i)=C([i\times p_j] \bmod (p-1)),$$

where j=0,1,2, . . . , (R−1), i=0,1,2, . . . , (p−[1] *2*), $C_j(p-1)=0$, and $C_j(p)=p$, and if (K=C×R), then $C_{R-1}(p)$ is exchanged with $C_{R-1}(0)$, selecting R rows according to a predetermined order P(j), and selecting one input sequence from the selected row; and providing the selected input sequence as a read address for interleaving the information bits of the input frame.

*17. The turbo encoder as claimed in claim 1, wherein the interleaver is further configured for permuting addresses of the information bits written in a jth row, where, j=0, 1, 2, . . . , R−1, to positions $C_j(i)$ in the row in accordance with an algorithm given by*

*i)* $C(i)=[g0\times C(i-1)] \bmod p$, *i=1,2, . . . ,(p−2) and C(0)=1*

*ii)* $C_j(i)=C([i\times p_j] \bmod (p-1))$, *j=0,1,2, . . . ,(R−1), i=0,1, 2, . . . ,(p−2),* $C_j(p-1)=0$, *and* $C_j(p)=p$

*iii) exchange* $C_{R-1}(p)$ *with* $C_{R-1}(0)$

*where p indicates a minimum prime number satisfying* $0\leqq(p+1)-K/R$, *g0 indicates an associated primitive root for p, and* $p_j$ *indicates a prime number set.*

*18. A device for permuting information bit addresses of an input frame, the input frame having Row (R) groups, each of the R groups having Column (C) information bits, the device being configured in an internal interleaver for a turbo encoder, the device comprising:*

*a memory configured for storing the information bits frame sequentially; and*

*a randomizer configured for*

*intra-row permuting an address of the stored information bits in each row according to a given interleaving rule,*

*exchanging an address of an information bit existing at a last position of a last group with an address of an information bit existing at a first position of the last group, after the intra-row permuting,*

*performing inter-row permutations, and*

*reading out the information bits, column by column, starting in the first row of the first column.*

*19. A device for interleaving a frame of K information bits, the frame having Row (R) groups, each the R groups having Column (C) information bits, the device comprising:*

*an interleaver for two-dimensional interleaving for a turbo encoder configured for sequentially writing input information bits of a frame in a memory and permuting positions of the information bits written in a jth row to a position* $C_j(i)$ *in the row, where, j can be 0,1,2 . . . , or R−1, in accordance with an algorithm given by*

*iv) permute a base sequence* $C(i)=[g0\times C(i-1)] \bmod p$, *i=1,2, . . . ,(p−2) and C(0)=1,*

*v) perform row permutation* $C_j(i)=C([i\times p_j] \bmod (p-1))$, *j=0,1.2, . . ,(R−1), i=0,1,2, . . . , (p−2),* $C_j(p-1)=0$, *and* $C_j(p)=p$,

*vi) exchange* $C_{R-1}(p)$ *with* $C_{R-1}(0)$;

*where K specifies a number of input information bits in a frame, p indicates a minimum prime number satisfying* $0\leqq(p+1)-K/R$, *g0 indicates an associated primitive root for p, and* $p_j$ *indicates a prime number set.*

*20. The device according to claim 19, further comprising a randomizer configured for permuting the addresses of the stored information bits in accordance with exchanged positions of the stored information bits.*

*21. A two-dimensional interleaving method comprising the steps of:*

*sequentially storing a frame of K input information bits, the frame having Row (R) groups, each of the R groups having Column (C) information bits;*

*permuting information bit addresses of the each of the R groups according to a given interleaving rule; and*

*exchanging an address of an information bit existing at a last position of a last group with an address of an information bit existing at a first position of the last group, subsequent to the permuting.*

*22. The two-dimensional interleaving method as claimed in claim 21, wherein the step of permuting comprises:*

*determining a minimum prime number p satisfying* $0 \leqq (p+1)-K/R$;

*selecting a primitive root g0 associated with the minimum prime number p, and*

*generating a base sequence C(i) for intra-row permuting of the input sequences written in the rows in accordance with*

$C(i)=[g0 \times C(i-1)] \bmod p,\ i=1,2,\ldots,(p-2)$, and $C(0)=1$;

*calculating a minimum prime integer set* $\{q_j\}(j=0,1,2,\ldots,R-1)$ *by determining*

$g.c.d\{q_j, p-1\}=1$ $q_j>6,\ q_j>q_{(j-1)}$

*where g.c.d is a greatest common divider and* $q_0=1$;

*intra-row permuting* $\{q_j\}$ *using*

$p_{P(j)}=q_j,\ j=0,1,\ldots,R-1$

*where P(j) indicates a predetermined selecting order for selecting the R rows; and*

*when C=p+1, permuting sequences in a jth row in accordance with*

$C_j(i)=C([i \times p_j] \bmod (p-1))$,

*where* $j=0,1,2,\ldots,(R-1),\ i=0,1,2,\ldots,(p-2),\ C_j(p-1)=0$, *and* $C_j(p)=p$,

*and if* $(K=C \times R)$, *then* $C_{R-1}(p)$ *is exchanged with* $C_{R-1}(0)$.

*23. A two-dimensional interleaving method comprising the steps of:*

*writing input sequences of a frame of input information bits in a memory, the frame having Row (R) groups, each of the R groups having Column (C) information bits;*

*permuting addresses of the information bits written in the memory according to a given interleaving rule; and*

*exchanging an address of an information bit written in a last position of a last group with an information bit written in a first position of the last group, subsequent to the permuting.*

*24. A method for interleaving a frame of input information bits, the frame having Row (R) groups, each of the R groups having Column (C) information bits, the method for use in an internal interleaver of a turbo encoder, the method comprising the steps of:*

*a) permuting information bit positions of the groups according to predetermined interleaving rule; and*

*b) exchanging an information bit existing at a last position of a last group with an information bit existing at a first position of the last group.*

*25. The method as claimed in claim 24, wherein in the step a) and b), the R groups are rows and the information bits positions of the frame written in a jth row, where* $j=0,1,2,\ldots,R-1$, *are permuted with positions* $C_j(i)$ *in the row in accordance with an algorithm given by*

*i) calculating* $C(i)=[g0 \times C(i-1)] \bmod p,\ i=1,2,\ldots,(p-2)$ *and* $C(0)=1$

*ii) calculating* $C_j(i)=C([i \times p_j] \bmod (p-1))$, *where* $j=0,1,2,\ldots,(R-1),\ i=0,1,2,\ldots,(p-2),\ C_j(p-1)=0$, *and* $C_j(p)=p$

*iii) exchanging* $C_{R-1}(p)$ *with* $C_{R-1}(0)$

*where k specifies a number of input information bits in a frame, p indicates a minimum prime number satisfying* $0 \leqq (p+1)-K/R$, *g0 indicates an associated primitive root for p,* $p_j$ *indicates a prime number set, and* $C_j(i)$ *is the input bit position of an ith output after the permutation of a jth row.*

*26. A two-dimensional interleaving method comprising the steps of:*

*sequentially writing input sequences of information bits of a frame in a Row (R)×Column (C) rectangular matrix, the frame having R groups, each of the R groups having C information bits;*

*selecting a primitive root g0 corresponding to a minimum prime number p satisfying* $0 \leqq (p+1)-K/R$;

*generating a base sequence C(i) for intra-row permuting the input sequences written in the rows in accordance with*

$C(i)=[g0 \times C(i-1)] \bmod p,\ i=1,2,\ldots,(p-2)$, and $C(0)=1$;

*calculating a minimum prime integer set* $\{q_i\}(j=0,1,2,\ldots,R-1)$ *by determining*

$g.c.d\{q_j, p-1\}=1$ $q_j>6,\ q_j>q_{(j-1)}$

*where g.c.d is a greatest common divider and* $q_0=1$;

*intra-row permuting* $\{q_j\}$ *using*

$p_{P(j)}=q_j,\ j=0,1,\ldots,R-1$

*where P(j) indicates a predetermined selecting order for selecting the R rows;*

*when C=p+1, permuting sequences in a jth row in accordance with*

$C_j(i)=C([i \times p_j] \bmod (p-1))$,

*where* $j=0,1,2,\ldots,(R-1),\ i=0,1,2,\ldots,(p-2),\ C_j(p-1)=0$, *and* $C_j(p)=p$,

*and if* $(K=C \times R)$, *then* $C_{R-1}(p)$ *is exchanged with* $C_{R-1}(0)$,

*selecting R rows according to a predetermined order P(j);*

*selecting an input sequence from the selected rows; and*

*providing the selected input sequence as read addresses for interleaving the information bits of the input frame.*

*27. A two-dimensional interleaving method comprising the steps of:*

*sequentially storing a frame of K input information bits, the frame having Row (R) groups, each of the R groups having Column (C) information bits;*

*permuting the information bits addresses of each of the R groups according to a given interleaving rule; and*

*exchanging an address of an information bit existing at a last position of a last group with an information bit existing at a first position of the last group, subsequent to the permuting.*

*28. A method for interleaving a frame of input information bits, the frame having Row (R) groups, each of the R groups having Column (C) information bits, the method for use in an internal interleaver of a turbo encoder, the method comprising the steps of:*

*a) permuting the information bit positions of the groups according to predetermined interleaving rule; and*

*b) exchanging an information bit position existing at a last position of a last group with an information bit existing at a first position of the last group.*

*29. The method as claimed in claim 28, wherein in the step a) and b), the R groups are rows and the information bit positions of the frame written in a jth row, where* $j=0,1,2,\ldots,R-1$, *are permuted with positions* $C_j(i)$ *in the row in accordance with the steps of an algorithm given by*

*i) calculating* $C(i)=[g0 \times C(i-1)] \bmod p,\ i=1,2,\ldots,(p-2)$ *and* $C(0)=1$

*ii) calculating* $C_j(i)=C([i \times p_j] \bmod (p-1)),\ j=0,1,2,\ldots,(R-1),\ i=0,1,2,\ldots,(p-21),\ C_j(p-1)=0$, *and* $C_j(p-1)=p$

*iii) exchanging* $C_{R-1}(p)$ *with* $C_{R-1}(0)$

*where K specifies a number of input information bits in a frame, p indicates a minimum prime number, which is closest to K/R while satisfying* $0 \leqq (p+1)-K/R$, *g0 indicates an associated primitive root for predetermined number corresponding to p,* $p_j$ *indicates a primitive prime number set and* $C_j(i)$ *is the information bit position of an ith output after the permutation of a jth row.*

*30. A turbo encoder comprising:*

*a first encoder configured for encoding a frame of K input information bits to generate first coded symbols;*

*an interleaver configured for*

*sequentially writing the K input information bits into a Row (R)×Column (C) rectangular matrix, row by row, starting in a first column of a first row,*

*intra row permuting positions of the information bits in the R×C rectangular matrix in each row according to a given interleaving rule,*

*exchanging a position of an information bit in a last column of a last row with a position within the last row which precedes the last column, after the intra row permuting,*

*performing inter-row permutations of the R×C rectangular matrix, and*

*reading out the information bits from the permuted R×C rectangular matrix, column by column, starting in the first row of the first column; and*

*a second encoder configured for encoding the read out information bits to generate second coded symbols,*

*wherein the R×C rectangular matrix includes R rows and C columns, K=R×C, and K indicates a number of the input information bits included in the frame.*

*31. The turbo encoder as claimed in claim 30, wherein the turbo encoder is further configured to store the input information bits in a memory, to perform the interleaving of the information bits in the R×C rectangular matrix based on generated read addresses corresponding to the permuted R×C rectangular matrix, and to output the information bits from the memory using the generated read addresses.*

*32. The turbo encoder as claimed in claim 30, wherein the turbo encoder is further configured to exchange the position of the information bit in the last column of the last row with a position of an information bit in the first column of the last row.*

* * * * *